US010600763B1

(12) United States Patent
Xiao

(10) Patent No.: US 10,600,763 B1
(45) Date of Patent: Mar. 24, 2020

(54) MULTI-DECK THREE-DIMENSIONAL MEMORY DEVICES AND METHODS FOR FORMING THE SAME

(71) Applicant: YANGTZE MEMORY TECHNOLOGIES CO., LTD., Wuhan (CN)

(72) Inventor: Li Hong Xiao, Wuhan (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 0 days.

(21) Appl. No.: 16/453,927

(22) Filed: Jun. 26, 2019

Related U.S. Application Data

(63) Continuation of application No. PCT/CN2019/081946, filed on Apr. 9, 2019.

(30) Foreign Application Priority Data

Dec. 18, 2018 (CN) .......................... 2018 1 1547690

(51) Int. Cl.
*H01L 25/065* (2006.01)
*H01L 23/00* (2006.01)
(Continued)

(52) U.S. Cl.
CPC .... *H01L 25/0657* (2013.01); *H01L 21/76898* (2013.01); *H01L 23/481* (2013.01);
(Continued)

(58) Field of Classification Search
CPC ......... H01L 27/11568; H01L 27/11521; H01L 25/0659; H01L 21/76898; H01L 23/481;
(Continued)

(56) References Cited

U.S. PATENT DOCUMENTS 9,263,459 B1* 2/2016 Li ..................... H01L 23/528
10,256,115 B2* 4/2019 Lee .................... H01L 21/486
(Continued)

FOREIGN PATENT DOCUMENTS

CN 104701323 A 6/2015
CN 107863348 A 3/2018
(Continued)

OTHER PUBLICATIONS

International Search Report issued in corresponding International Application No. PCT/CN2019/081946 dated Sep. 23, 2019, 4 pages.
(Continued)

*Primary Examiner* — Savitri Mulpuri
(74) *Attorney, Agent, or Firm* — Bayes PLLC

(57) ABSTRACT

Embodiments of three-dimensional (3D) memory devices and methods for forming the 3D memory devices are disclosed. In an example, a 3D memory device includes a substrate, a first memory deck above the substrate, a first channel structure, a first inter-deck plug above and in contact with the first channel structure, a second memory deck above the first inter-deck plug, and a second channel structure above and in contact with the first inter-deck plug. The first memory deck includes a first plurality of interleaved conductor layers and dielectric layers. The first channel structure extends vertically through the first memory deck. The first inter-deck plug includes single-crystal silicon. The second memory deck includes a second plurality of interleaved conductor layers and dielectric layers. The second channel structure extends vertically through the second memory deck.

19 Claims, 21 Drawing Sheets

(51) Int. Cl.
    *H01L 27/11524*    (2017.01)
    *H01L 27/11556*    (2017.01)
    *H01L 27/1157*     (2017.01)
    *H01L 27/11582*    (2017.01)
    *H01L 23/48*       (2006.01)
    *H01L 25/00*       (2006.01)
    *H01L 21/768*      (2006.01)
    *H01L 25/18*       (2006.01)

(52) U.S. Cl.
    CPC .............. *H01L 24/08* (2013.01); *H01L 24/80* (2013.01); *H01L 25/18* (2013.01); *H01L 25/50* (2013.01); *H01L 27/1157* (2013.01); *H01L 27/11524* (2013.01); *H01L 27/11556* (2013.01); *H01L 27/11582* (2013.01); *H01L 2224/08145* (2013.01); *H01L 2224/80031* (2013.01); *H01L 2224/80894* (2013.01); *H01L 2225/06524* (2013.01); *H01L 2225/06544* (2013.01); *H01L 2924/1431* (2013.01); *H01L 2924/14511* (2013.01)

(58) Field of Classification Search
    CPC ......... H01L 24/08; H01L 24/80; H01L 25/18; H01L 25/50; H01L 27/11524; H01L 27/11556; H01L 27/1157; H01L 27/11582
    See application file for complete search history.

(56) References Cited

U.S. PATENT DOCUMENTS

| | | | | |
|---|---|---|---|---|
| 10,483,271 | B2* | 11/2019 | Wang | H01L 27/11582 |
| 10,515,975 | B1* | 12/2019 | Tao | H01L 27/11556 |
| 2013/0264536 | A1 | 10/2013 | Tour et al. | |
| 2013/0330894 | A1 | 12/2013 | Gu et al. | |
| 2017/0047343 | A1 | 2/2017 | Lee et al. | |
| 2017/0154892 | A1* | 6/2017 | Oh | H01L 27/1052 |
| 2017/0301688 | A1 | 10/2017 | Lee et al. | |
| 2019/0067324 | A1* | 2/2019 | Zhang | H01L 27/11582 |
| 2019/0198109 | A1* | 6/2019 | Li | G11C 8/08 |
| 2019/0326314 | A1* | 10/2019 | Xiao | H01L 27/11556 |
| 2019/0378853 | A1* | 12/2019 | Xiao | H01L 21/76816 |
| 2020/0006299 | A1* | 1/2020 | Liu | H01L 23/49816 |

FOREIGN PATENT DOCUMENTS

| | | |
|---|---|---|
| CN | 108511449 A | 9/2018 |
| CN | 108565266 A | 9/2018 |
| CN | 108807411 A | 11/2018 |
| CN | 108847413 A | 11/2018 |

OTHER PUBLICATIONS

Written Opinion of the International Searching Authority issued in corresponding International Application No. PCT/CN2019/081946 dated Sep. 23, 2019, 4 pages.

International Search Report issued in corresponding International Application No. PCT/CN2019/081951 dated Sep. 19, 2019, 5 pages.

Written Opinion of the International Searching Authority issued in corresponding International Application No. PCT/CN2019/081951 dated Sep. 19, 2019, 5 pages.

International Search Report issued in corresponding International Application No. PCT/CN2019/081957 dated Sep. 18, 2019, 5 pages.

Written Opinion of the International Searching Authority issued in corresponding International Application No. PCT/CN2019/081957 dated Sep. 18, 2019, 5 pages.

* cited by examiner

… (1)
MULTI-DECK THREE-DIMENSIONAL MEMORY DEVICES AND METHODS FOR FORMING THE SAME

CROSS-REFERENCE TO RELATED APPLICATIONS

This application is a continuation of International Application No. PCT/CN2019/081946, filed on Apr. 9, 2019, entitled "MULTI-DECK THREE-DIMENSIONAL MEMORY DEVICES AND METHODS FOR FORMING THE SAME," which claims the benefit of priority to Chinese Patent Application No. 201811547690.7 filed on Dec. 18, 2018, both of which are incorporated herein by reference in their entireties. This application is also related to co-pending U.S. application Ser. No. 16/453,946, filed on even date, entitled "MULTI-STACK THREE-DIMENSIONAL MEMORY DEVICES AND METHODS FOR FORMING THE SAME," and co-pending U.S. application Ser. No. 16/453,960, filed on even date, entitled "THREE-DIMENSIONAL MEMORY DEVICES HAVING TRANSFERRED INTERCONNECT LAYER AND METHODS FOR FORMING THE SAME," both of which are incorporated therein by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a 3D memory device includes a substrate, a first memory deck above the substrate, a first channel structure, a first inter-deck plug above and in contact with the first channel structure, a second memory deck above the first inter-deck plug, and a second channel structure above and in contact with the first inter-deck plug. The first memory deck includes a first plurality of interleaved conductor layers and dielectric layers. The first channel structure extends vertically through the first memory deck. The first inter-deck plug includes single-crystal silicon. The second memory deck includes a second plurality of interleaved conductor layers and dielectric layers. The second channel structure extends vertically through the second memory deck.

In another example, a method for forming a 3D memory device is disclosed. A first dielectric deck including a first plurality of interleaved sacrificial layers and dielectric layers is formed above a first substrate. A first channel structure extending vertically through the first dielectric deck is formed. A heterogeneous interface is formed in a second substrate. The second substrate and the first substrate are bonded in a face-to-face manner A single-crystal silicon layer is split from the second substrate along the heterogeneous interface in the second substrate to leave the single-crystal silicon layer bonded on the first dielectric deck. A first inter-deck plug including single-crystal silicon is patterned in the single-crystal silicon layer, such that the first inter-deck plug is above and in contact with the first channel structure. A second dielectric deck including a second plurality of interleaved sacrificial layers and dielectric layers is formed above the first inter-deck plug. A second channel structure extending vertically through the second dielectric deck is formed, such that the second channel structure is above and in contact with the first inter-deck plug. A first memory deck and a second memory deck each including interleaved conductor layers and the dielectric layers are formed by replacing the sacrificial layers in the first dielectric deck and the second dielectric deck with the conductor layers.

In still another example, a method for forming a 3D memory device is disclosed. A first channel structure extending vertically through a first dielectric deck including a first plurality of interleaved sacrificial layers and dielectric layers is formed above a first substrate. A first single-crystal silicon layer is transferred from a second substrate onto the first dielectric deck above the first substrate. A first inter-deck plug is patterned in the first single-crystal silicon layer, such that the first inter-deck plug is above and in contact with the first channel structure. A second channel structure extending vertically through a second dielectric deck including a second plurality of interleaved sacrificial layers and dielectric layers is formed above the first inter-deck plug, such that the second channel structure is above and in contact with the first inter-deck plug. A second single-crystal silicon layer is transferred from the second substrate onto the second dielectric deck above the first substrate. A second inter-deck plug is patterned in the second single-crystal silicon layer, such that the second inter-deck plug is above and in contact with the second channel structure. A third channel structure extending vertically through a third dielectric deck including a third plurality of interleaved sacrificial layers and dielectric layers is formed above the second inter-deck plug, such that the third channel structure is above and in contact with the second inter-deck plug.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
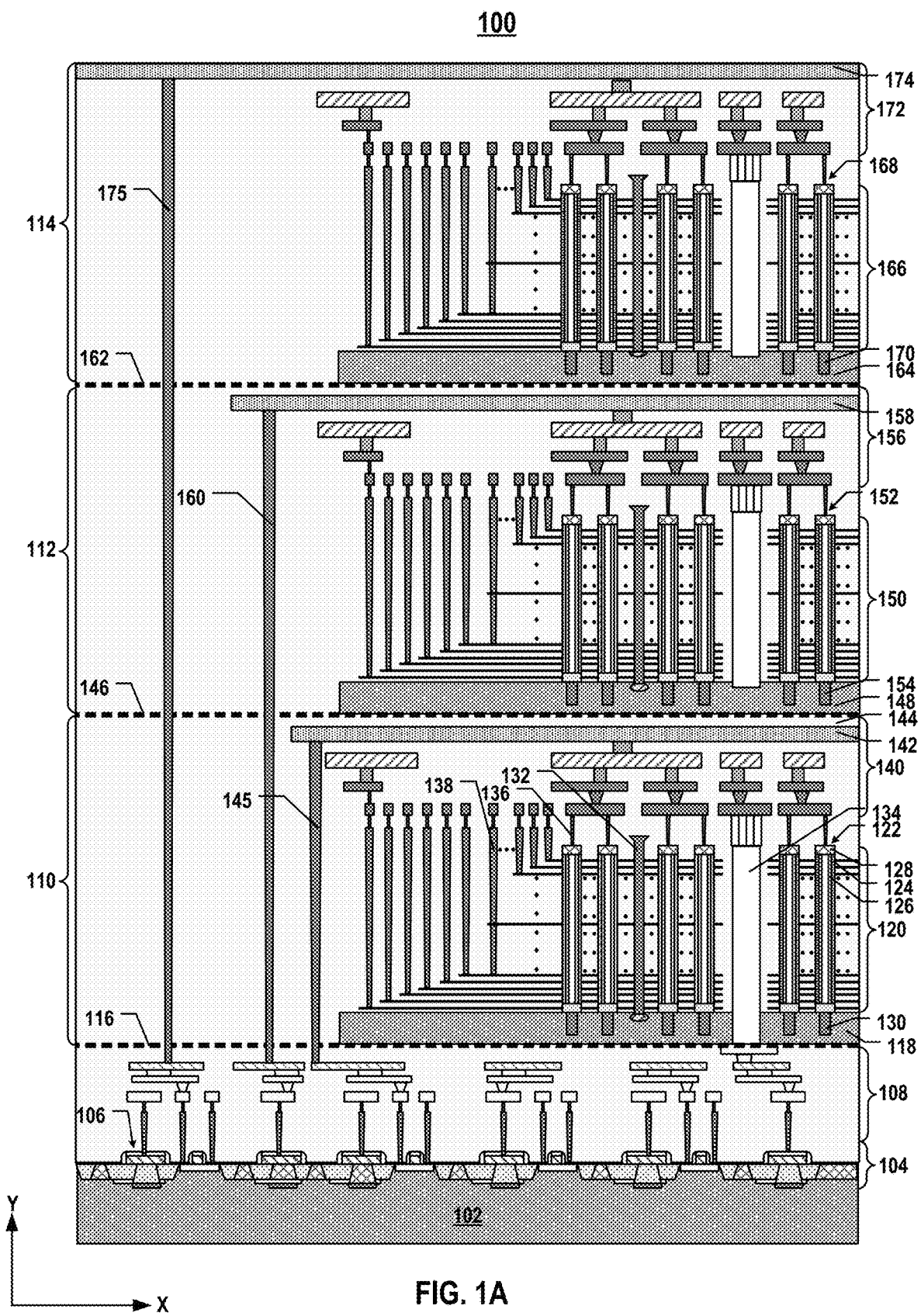
FIG. 1A illustrates a cross-section of one example of a multi-stack 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In fabricating 3D NAND memory devices with advanced technologies, such as having 96 or more levels, a multi-deck architecture is usually used, which includes two or more stacked channel structures that can be electrically connected by inter-deck plugs (also known as "inter-deck joints"). In some 3D NAND memory devices, a multi-stack architecture is used to further vertically scale up memory cells at memory stack levels, for example, by having multiple memory stacks each including channel structures, local contacts, and interconnects, and that is built up upon an underneath source layer. The inter-deck plugs in the multi-deck architecture and/or the source layers in the multi-stack architecture, however, are made of polycrystalline silicon (polysilicon) using deposition processes, which is a semiconductor material known for carrier mobility loss during long transport. The performances of the 3D NAND memory devices with the multi-deck and/or the multi-stack architectures are thus limited by the electric performance of polysilicon inter-deck plugs and/or source layers.

Another way of increasing 3D NAND memory cell density is bonding one or more 3D NAND memory device chips and peripheral device chip using hybrid bonding process. However, hybrid bonding process requires high alignment accuracy and may induce voids at the bonding interface due to metal migration caused by thermal process, which can impact the device yield. Moreover, as the memory cell level and density increase, the density of interconnects, such as bit line density, are increased as well, thereby increasing the fabrication complexity and cycle time.

Various embodiments in accordance with the present disclosure provide various types of vertically-scalable 3D memory devices and methods for forming the 3D memory devices with improved performance, shortened fabrication cycle, and higher yield compared with some other 3D memory devices. A de-bonding process that transfers a single-crystal silicon layer from a silicon substrate (known as a "donor substrate") to a memory device structure can be used to form a multi-deck 3D memory device having single-crystal silicon inter-deck plugs or a multi-stack 3D memory device having single-crystal silicon source layers. By replacing polysilicon with single-crystal silicon, which has higher carrier mobility, higher cell storage capacity with better cell performance at inter-deck joint and source can be achieved. The single-crystal silicon layer can be bonded to the memory device structure using a silicon-dielectric bonding process, which has a higher yield and bonding strength compared with hybrid bonding. Moreover, interconnects, such as bit lines, may be formed on dedicated donor substrates in parallel with memory device structure fabrication and then transferred to the memory device structure using the de-bonding process, which can significantly shorten fabrication cycle time. In some embodiments, the silicon donor substrate from which the single-crystal silicon layers and/or interconnects are transferred can be repeated used to further save wafer cost.

Figure 1B:
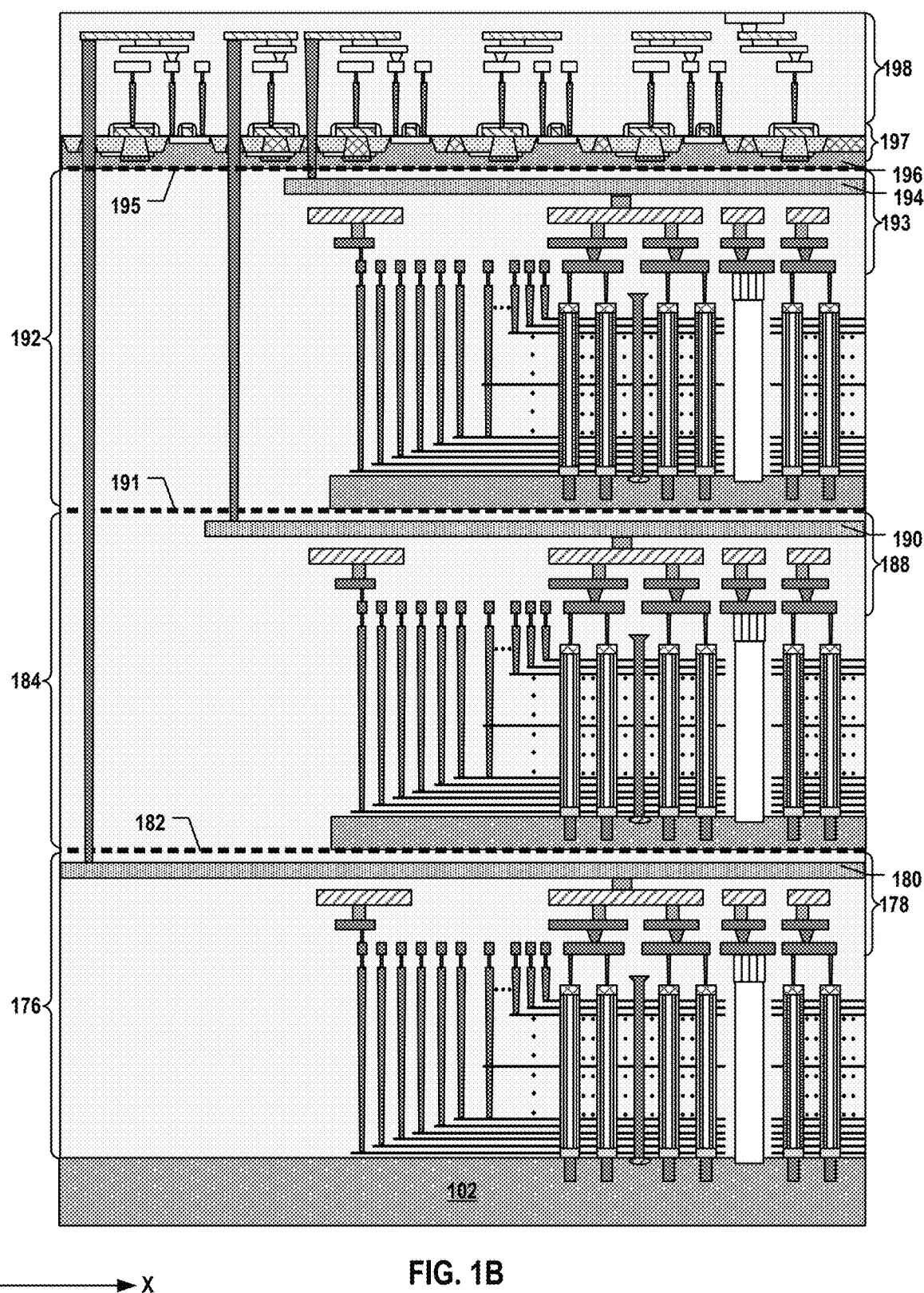
FIG. 1B illustrates a cross-section of another example of the multi-stack 3D memory device, according to some embodiments of the present disclosure.
Figure 1C:
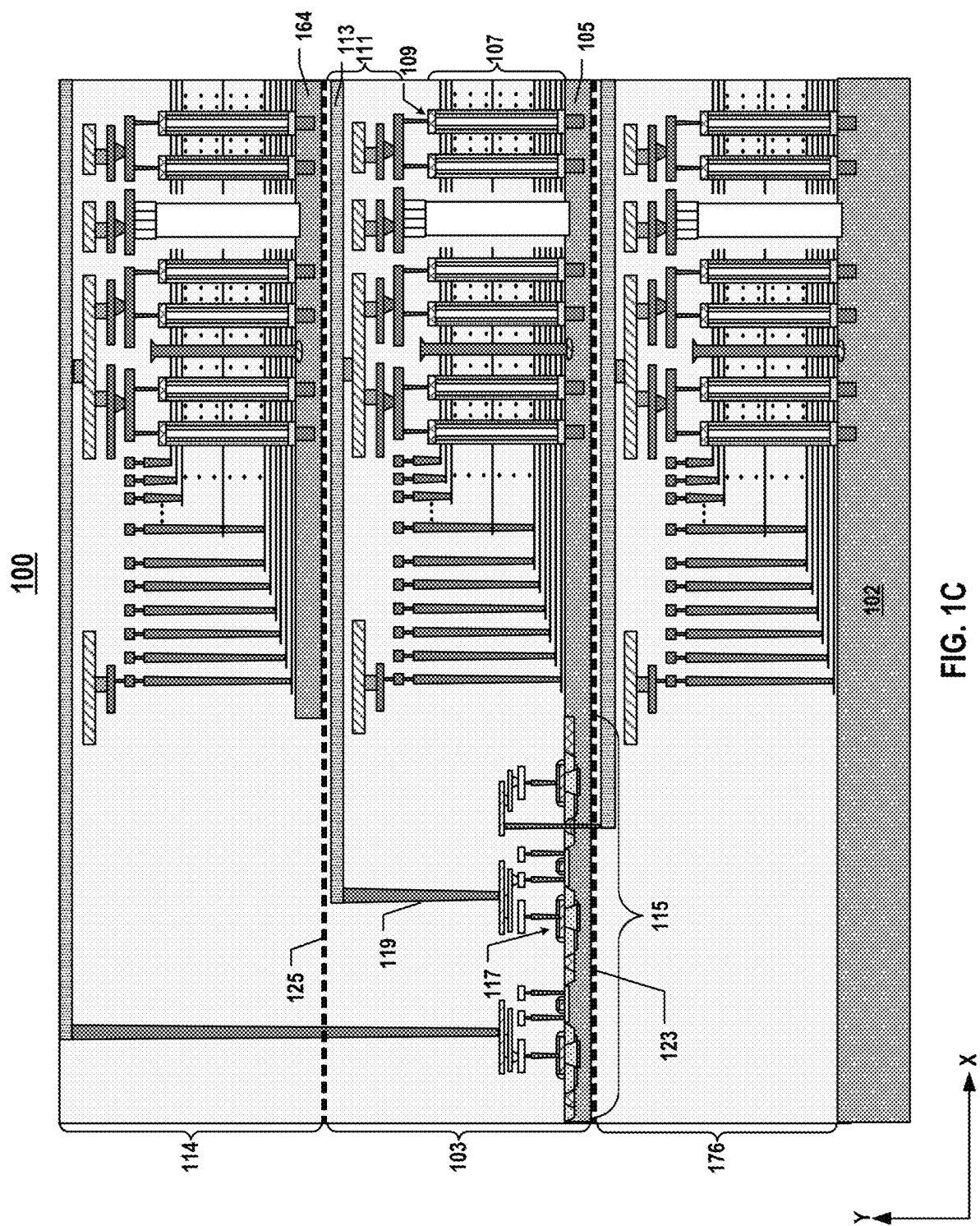
FIG. 1C illustrates a cross-section of still another example of the multi-stack 3D memory device, according to some embodiments of the present disclosure.

FIG. 1A-1C illustrates different examples of cross-sections of an exemplary multi-stack 3D memory device 100, according to various embodiments of the present disclosure. 3D memory device 100 can have a multi-stack architecture with stacked memory array device structures each including a memory stack and an array of channel structures formed on a single-crystal silicon layer (e.g., as the source layer of the memory strings). 3D memory device 100 represents an example of a non-monolithic 3D memory device. The term "non-monolithic" means that the components of a 3D memory device (e.g., the peripheral device and/or memory array devices) can be formed separately on different substrates and then joined, for example, by bonding techniques, to form the 3D memory device. As described below in detail, the bonding techniques, such as silicon-dielectric bonding, can be part of or combined with a "de-bonding" process that transfers a single-crystal silicon layer (with or without other structures formed thereon) between different substrates. It is understood that the de-bonding process can provide flexibility of connecting any number of device structures in any vertical arrangement to increase the cell density and production yield of 3D memory device 100. It is also understood that memory array device structures (and memory stacks thereof) are vertically-scalable to further increase the cell density. It is further understood that the peripheral device layer and memory array device structures can be stacked in any order. For example, the peripheral device layer can be disposed at the bottom, at the top, or in the middle of 3D memory device 100.

As shown in FIG. 1A, 3D memory device 100 can include a substrate 102, which can include silicon (e.g., single-crystal silicon), silicon germanium (SiGe), gallium arsenide (GaAs), germanium (Ge), silicon on insulator (SOI), or any other suitable materials. In some embodiments, 3D memory device 100 includes a peripheral device layer 104 on substrate 102. Peripheral device layer 104 can be formed "on" substrate 102, in which the entirety or part of peripheral device layer 104 is formed in substrate 102 (e.g., below the top surface of substrate 102) and/or directly on substrate 102. Peripheral device layer 104 can include a plurality of transistors 106 formed on substrate 102. Isolation regions (e.g., shallow trench isolations (STIs)) and doped regions (e.g., source regions and drain regions) of transistors 106 can be formed in substrate 102 as well.

Peripheral device layer 104 can include any suitable digital, analog, and/or mixed-signal peripheral circuits used for facilitating the operation of 3D memory device 100. For example, peripheral device layer 104 can include one or more of a data buffer (e.g., a bit line page buffer), a decoder (e.g., a row decoder or a column decoder), a sense amplifier, a driver (e.g., a word line driver), a charge pump, a current or voltage reference, or any active or passive components of the circuits (e.g., transistors, diodes, resistors, or capacitors). In some embodiments, peripheral device layer 104 is formed on substrate 102 using complementary metal-oxide-semiconductor (CMOS) technology.

In some embodiments, peripheral device layer 104 includes a multiplexer. A multiplexer (also known as "MUX") is a device that selects one of several analog or digital input signals and forwards the selected input into a single line. In some embodiments, the multiplexer is configured to select one of multiple channel structures in different memory stacks and forward the input from the selected channel structures into a data buffer and/or a driver, such as a bit line page buffer and/or a word line driver. That is, the data buffer and driver of peripheral device layer 104 can be shared by multiple channel structures through the multiplexer.

3D memory device 100 can include an interconnect layer (also referred to herein as a "peripheral interconnect layer" 108) above peripheral device layer 104 to transfer electrical signals to and from peripheral device layer 104. Peripheral interconnect layer 108 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Peripheral interconnect layer 108 can further include one or more interlayer dielectric (ILD) layers (also known as "intermetal dielectric (IMD) layers") in which the interconnects can form. That is, peripheral interconnect layer 108 can include interconnects in multiple ILD layers. The interconnects in peripheral interconnect layer 108 can include conductive materials including, but not limited to, tungsten (W), cobalt (Co), copper (Cu), aluminum (Al), silicides, or any combination thereof. The ILD layers in peripheral interconnect layer 108 can include dielectric materials including, but not limited to, silicon oxide, silicon nitride, silicon oxynitride, low dielectric constant (low-k) dielectrics, or any combination thereof.

3D memory device 100 can include a plurality of memory array device structures 110, 112, and 114 stacked above peripheral device layer 104 and peripheral interconnect layer 108. It is noted that x and y axes are added in FIG. 1A to further illustrate the spatial relationship of the components in 3D memory device 100. Substrate 102 includes two lateral surfaces (e.g., a top surface and a bottom surface) extending laterally in the x-direction (the lateral direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the y-direction (the vertical direction) when the substrate is positioned in the lowest plane of the semiconductor device in the y-direction. The same notion for describing spatial relationship is applied throughout the present disclosure.

In some embodiments, 3D memory device 100 is a NAND Flash memory device in which memory cells are provided in the form of an array of NAND memory strings. Each array of NAND memory strings can be formed in a memory stack, and each NAND memory string can include one channel structure or multiple cascaded channel structures. As shown in FIG. 1A, 3D memory device 100 can include three memory array device structures 110, 112, and 114 stacked above peripheral device layer 104 and peripheral interconnect layer 108. Each memory array device structure 110, 112, or 114 can include a single-crystal silicon layer in which the sources of NAND memory strings are formed (also referred to herein as "single-crystal silicon source layer"), a memory stack on the single-crystal silicon source layer, and an array of channel structures each extending vertically through the memory stack and into the single-crystal silicon source layer. Each memory array device structure 110, 112, or 114 can further include an interconnect layer (also referred to herein as "array interconnect layer"), which includes bit lines, above the respective memory stack and channel structures. It is understood that 3D memory device 100 may include less than or more than three memory array device structures above peripheral device layer 104 and peripheral interconnect layer 108 in other embodiments.

As shown in FIG. 1A, first memory array device structure 110 of 3D memory device 100 can include a first single-crystal silicon layer 118, a first memory stack 120, an array of first channel structures 122, and a first array interconnect layer 140. In some embodiments, first single-crystal silicon layer 118 is transferred from another substrate other than substrate 102 (a donor substrate) and bonded onto peripheral interconnect layer 108 above peripheral device layer 104. As a result, first memory array device structure 110 can also include a first bonding interface 116 between substrate 102 and first single-crystal silicon layer 118. In some embodiments, first bonding interface 116 is the place at which peripheral interconnect layer 108 and first single-crystal silicon layer 118 are met and bonded. In practice, first bonding interface 116 can be a layer with a certain thickness that includes the top surface of peripheral interconnect layer 108 and the bottom surface of first single-crystal silicon layer 118.

First single-crystal silicon layer 118 can be disposed above first bonding interface 116 and peripheral interconnect layer 108. First single-crystal silicon layer 118 can include single-crystal silicon, for example, can be fully made of single-crystal silicon, which has superior electric performances (e.g., higher carrier mobility) than silicon in other forms, such as polysilicon or amorphous silicon. In some embodiments, first single-crystal silicon layer 118 includes compound materials formed from single-crystal silicon, such as metal silicides that have silicon with metal elements including, but not limited to, titanium silicide, cobalt silicide, nickel silicide, tungsten silicide, etc. First single-crystal silicon layer 118 can function as the common source of array of first channel structures 122.

In some embodiments, the thickness of first single-crystal silicon layer 118 is between about 1 μm and about 100 μm, such as between 1 μm and 100 μm (e.g., 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, any range bounded by the lower end by any of these values, or any range defined by any two of these values). In some embodiments, as the base on which first memory stack 120 can form, first single-crystal silicon layer 118 extends laterally along at least the width of first memory stack 120 (e.g., in the x-direction as shown in FIG. 1A). It is understood that the initial lateral dimensions of first single-crystal silicon layer 118 may be determined by the lateral dimensions of the donor substrate from which first single-crystal silicon layer 118 is transferred and may be changed after being bonded above substrate 102, for example, by patterning and etching first single-crystal silicon layer 118.

In some embodiments, first memory array device structure 110 includes first channel structures 122 each of which extends vertically through a first plurality of pairs each including a conductor layer and a dielectric layer (referred to herein as "conductor/dielectric layer pairs"). The stacked conductor/dielectric layer pairs are also referred to herein as first memory stack 120. The interleaved conductor layers and dielectric layers in first memory stack 120 alternate in the vertical direction, according to some embodiments. In other words, except the ones at the top or bottom of first memory stack 120, each conductor layer can be adjoined by two dielectric layers on both sides, and each dielectric layer can be adjoined by two conductor layers on both sides. The conductor layers in first memory stack 120 can include conductive materials including, but not limited to, W, Co, Cu, Al, doped silicon, silicides, or any combination thereof. The dielectric layers in first memory stack 120 can include dielectric materials including, but not limited to, silicon oxide, silicon nitride, silicon oxynitride, or any combination thereof.

In some embodiments, 3D memory device 100 is a NAND Flash memory device in which memory cells are provided in the form of NAND memory strings, such as "charge trap" type of NAND memory string. Each first channel structure 122 can include a composite dielectric layer (also known as a "memory film" 124) and a semiconductor channel 126. In some embodiments, semiconductor channel 126 includes silicon, such as amorphous silicon, polysilicon, or single-crystal silicon. In some embodiments, memory film 124 includes a tunneling layer, a storage layer (also known as "charge trap layer"), and a blocking layer. Memory film 124 and semiconductor channel 126 are formed along the sidewall of first channel structure 122, according to some embodiments. Each first channel structure 122 can have a cylinder shape (e.g., a pillar shape). Semiconductor channel 126, the tunneling layer, the storage layer, and the blocking layer of memory film 124 are arranged along the radial direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as an aluminum oxide ($Al_2O_3$), or hafnium oxide ($HfO_2$) or tantalum oxide ($Ta_2O_5$) layer, and so on.

In some embodiments, first channel structures 122 further include a plurality of control gates (each being part of a word line). Each conductor layer in first memory stack 120 can act as a control gate for each memory cell of first channel structure 122. Each first channel structure 122 can include an upper plug 128 at its upper end and a lower plug 130 at its lower end. That is, semiconductor channel 126 is disposed vertically between and in contact with upper plug 128 and lower plug 130, respectively, according to some embodiments. As used herein, the "upper end" of a component (e.g., first channel structure 122) is the end farther away from substrate 102 in the y-direction, and the "lower end" of the component (e.g., first channel structure 122) is the end closer to substrate 102 in the y-direction.

In some embodiments, upper plug 128 includes semiconductor materials, such as polysilicon, and works as the drain of first channel structure 122. In some embodiments, lower plug 130 extends into first single-crystal silicon layer 118, i.e., below the top surface of first single-crystal silicon layer 118. Lower plug 130 includes semiconductor materials and works as part of the source of first channel structure 122, according to some embodiments. As shown in FIG. 1A, array of first channel structures 122 can share a common source, i.e., first single-crystal silicon layer 118, by contacting lower plugs 130 with first single-crystal silicon layer 118. In some embodiments, lower plug 130 is a selective epitaxial growth (SEG) plug epitaxially grown from first single-crystal silicon layer 118 at the lower end of first channel structure 122. As a SEG plug, lower plug 130 includes the same material as first single-crystal silicon layer 118, i.e., single-crystal silicon, according to some embodiments.

In some embodiments, first memory array device structure 110 further includes a slit structure 132 (e.g., a gate line slit ("GLS")) that extends vertically through first memory stack 120 to first single-crystal silicon layer 118. Slit structure 132 can be used to form the conductor/dielectric layer pairs in first memory stack 120 by a gate replacement process. In some embodiments, slit structure 132 is firstly filled with dielectric materials, for example, silicon oxide, silicon nitride, or any combination thereof, for separating array of first channel structures 122 into different regions (e.g., memory fingers and/or memory blocks). Then, slit structure 132 can be filled with conductive and/or semiconductor materials, for example, W, Co, polysilicon, or any combination thereof as a source conductor in contact with first single-crystal silicon layer 118 for electrically controlling an array common source (ACS).

As shown in FIG. 1A, first memory array device structure 110 can further include a through array contact (TAC) 134 extending vertically through first memory stack 120. TAC 134 can extend through the entire thickness of first memory stack 120. In some embodiments, TAC 134 further extends through at least part of first single-crystal silicon layer 118. TAC 134 can carry electrical signals from and/or to first memory array device structure 110, such as part of the power bus, with shortened interconnect routing. In some embodiments, TAC 134 is electrically connected to peripheral device layer 104 to provide electrical connections between peripheral device layer 104 (e.g., transistors 106) and first channel structures 122. TAC 134 can also provide mechanical support to first memory stack 120. In some embodiments, TAC 134 includes a vertical opening through first memory stack 120, which is filled with conductive materials, including, but not limited to, W, Co, Cu, Al, doped silicon, silicides, or any combination thereof.

In some embodiments, first memory stack 120 includes a staircase structure at one side of first memory stack 120 in the lateral direction to fan-out the word lines (e.g., parts of the conductor layers of first memory stack 120). The staircase structure can tilt toward the center of first memory stack 120 to fan-out the word lines in the vertical direction away from first single-crystal silicon layer 118 (e.g., the positive y-direction in FIG. 1A). First memory array device structure 110 further includes local contacts to electrically connect first channel structures 122 to first array interconnect layer 140, according to some embodiments. In some embodiments, as part of the local contacts, bit line contacts 136 are each in contact with the drain of respective first channel structure 122, such as upper plug 128, for individually addressing corresponding first channel structure 122. In some embodiments, as part of the local contacts, word line contacts 138 extend vertically within one or more ILD layers. Each word line contact 138 can have an upper end in contact with first array interconnect layer 140 and a lower end in contact with a corresponding conductor layer in first memory stack 120 at the staircase structure to individually address a corresponding word line of first channel structures 122. In some embodiments, the local contacts, including bit line contacts 136 and word line contacts 138, include contact holes and/or contact trenches filled with conductive materials, such as W, Co, Cu, Al, silicides, or any combination thereof.

First array interconnect layer 140 can be disposed above first memory stack 120 and first channel structures 122 therethrough to transfer electrical signals to and from first channel structures 122. First array interconnect layer 140 can include a plurality of interconnects, such as interconnect lines and via contacts, formed in one or more ILD layers. The interconnects in first array interconnect layer 140 can include conductive materials including, but not limited to, W, Co, Cu, Al, silicides, or any combination thereof. The ILD layers in first array interconnect layer 140 can include dielectric materials including, but not limited to, silicon oxide, silicon nitride, silicon oxynitride, low-k dielectrics, or any combination thereof.

In some embodiments, first array interconnect layer 140 includes a first bit line 142 disposed above and electrically connected to first channel structure 122. The drain at the upper end of first channel structure 122, e.g., upper plug 128, can be electrically connected to first bit line 142 through bit line contact 136. First bit line 142 can be electrically connected to peripheral device layer 104, such as a multiplexer, through a through silicon via (TSV) 145 and the interconnects in peripheral interconnect layer 108. As a result, first channel structure 122 can be electrically connected to peripheral device layer 104 through first bit line 142. First bit line 142 and TSV 145 can include conductive materials, such as W, Co, Cu, and Al, formed in one or more ILD layers above first bonding interface 116. In some embodiments, first array interconnect layer 140 further includes a passivation layer 144 (e.g., an ILD layer) formed on first bit line 142 as the top layer of first memory array device structure 110 to protect first bit line 142 and reduce electric coupling effect and current leakage between the interconnects in first array interconnect layer 140, such as first bit line 142, and components formed above first array interconnect layer 140. Passivation layer 144 can include dielectric materials including, but not limited to, silicon oxide, silicon nitride, silicon oxynitride, low-k dielectrics, or any combination thereof. It is understood that passivation layer 144 may not be needed in other embodiments as described below in detail.

First memory array device structure 110 can be formed by transferring first single-crystal silicon layer 118 from another donor substrate to substrate 102 using a de-bonding process, followed by forming other components, such as first memory stack 120, first channel structures 122, slit structure 132, TAC 134, the local contacts (e.g., word line contacts 138 and bit line contacts 136), and first array interconnect layer 140, above first single-crystal silicon layer 118. As described above, 3D memory device 100 can be vertically-scalable by including multiple memory array device structures stacked vertically, such as second memory array device structure 112 stacked above first memory array device structure 110. Similar to first memory array device structure 110, second memory array device structure 112 can include a second single-crystal silicon layer 148 disposed above first array interconnect layer 140, a second memory stack 150 disposed above second single-crystal silicon layer 148, an array of second channel structures 152 each extending vertically through second memory stack 150 and into second single-crystal silicon layer 148, and a second array interconnect layer 156 disposed above second memory stack 150 and including a second bit line 158. A second bonding interface 146 can be formed between first array interconnect layer 140 and second single-crystal silicon layer 148 as a result of bonding second single-crystal silicon layer 148 onto first memory array device structure 110.

Similar to first single-crystal silicon layer 118 in first memory array device structure 110, second single-crystal silicon layer 148 can include single-crystal silicon, for example, can be fully made of single-crystal silicon, which has superior electric performances (e.g., higher carrier mobility) than silicon in other forms, such as polysilicon or amorphous silicon. In some embodiments, second single-crystal silicon layer 148 includes compound materials formed from single-crystal silicon, such as metal silicides that have silicon with metal elements including, but not limited to, titanium silicide, cobalt silicide, nickel silicide, tungsten silicide, etc. Second single-crystal silicon layer 148 can function as the common source of array of second channel structures 152.

In some embodiments, the thickness of second single-crystal silicon layer 148 is between about 1 μm and about 100 μm, such as between 1 μm and 100 μm (e.g., 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, any range bounded by the lower end by any of these values, or any range defined by any two of these values). In some embodiments, as the base on which second memory stack 150 can form, second single-crystal silicon layer 148 extends laterally along at least the width of second memory stack 150 (e.g., in the x-direction as shown in FIG. 1A). It is understood that the initial lateral dimensions of second single-crystal silicon layer 148 may be determined by the lateral dimensions of the donor substrate from which second single-crystal silicon layer 148 is transferred and may be changed after being bonded above first array interconnect layer 140, for example, by patterning and etching second single-crystal silicon layer 148. The lateral dimensions of first and second single-crystal silicon layers 118 and 148 may be the same or different.

In some embodiments, second single-crystal silicon layer 148 is transferred from the same donor substrate from which first single-crystal silicon layer 118 is transferred to save wafer cost. It is understood that first and second single-crystal silicon layers 118 and 148 may be formed and transferred in parallel from two different donor substrates, respectively, to substrate 102 to further reduce fabrication cycle time in other embodiments. As a result of the de-bonding process performed again to bond second single-crystal silicon layer 148 onto first memory array device structure 110, second bonding interface 146 can be formed between first array interconnect layer 140 and second single-crystal silicon layer 148. In some embodiments, second bonding interface 146 is the place at which first array interconnect layer 140 and second single-crystal silicon layer 148 are met and bonded. In practice, second bonding interface 146 can be a layer with a certain thickness that includes the top surface of first array interconnect layer 140 and the bottom surface of second single-crystal silicon layer 148.

In some embodiments, second single-crystal silicon layer 148 is disposed directly on first bit line 142 in first array interconnect layer 140 without passivation layer 144 in-between. The same effect of reducing electric coupling and leakage between first array interconnect layer 140 and second memory stack 150 (and second channel structures 152) can be achieved by, for example, adjusting the thickness of second single-crystal silicon layer 148 and/or forming a well in second single-crystal silicon layer 148 by any suitable dopants at a desired doping level. Thus, second single-crystal silicon layer 148 can include a well between first array interconnect layer 140 and second memory stack 150.

Similar to the counterparts in first memory array device structure 110, second memory stack 150 can include a second plurality of conductor/dielectric layer pairs, i.e., interleaved conductor layers and dielectric layers, and second channel structure 152 can be a "charge trap" type of NAND memory string as described above in detail. In some embodiments, each second channel structure 152 includes a lower plug 154, such as a SEG plug, extending into second single-crystal silicon layer 148 as part of the source of the NAND memory string. Lower plug 154 can be epitaxially grown from second single-crystal silicon layer 148 at the lower end of second channel structure 152 and include single-crystal silicon, the same material as second single-crystal silicon layer 148. Second single-crystal silicon layer 148 can thus work as the source layer of array of second channel structures 152.

Similar to the counterparts in first memory array device structure 110, second memory array device structure 112 of 3D memory device 100 can also include second array interconnect layer 156 disposed above second memory stack 150 and second channel structures 152 therethrough to transfer electrical signals to and from second channel structures 152. In some embodiments, second array interconnect layer 156 includes second bit line 158 disposed above and electrically connected to second channel structure 152. The drain at the upper end of second channel structure 152 can be electrically connected to second bit line 158 through a bit line contact. Second bit line 158 can be electrically connected to peripheral device layer 104, such as a multiplexer, through a TSV 160 and the interconnects in peripheral interconnect layer 108. As a result, second channel structure 152 can be electrically connected to peripheral device layer 104 through second bit line 158. In some embodiments, a multiplexer in peripheral device layer 104 is configured to select one of first channel structure(s) 122 in first memory array device structure 110 and second channel structure(s) 152 in second memory array device structure 112. First channel structure(s) 122 in first memory array device structure 110 and second channel structure(s) 152 in second memory array device structure 112 share the same data buffer (e.g., the bit line page buffer) and/or driver (e.g., the word line driver) in peripheral device layer 104 by the multiplexer, according to some embodiments. Additional components of second memory array device structure 112, such as the slit structure, TAC, and local contacts, are substantially similar to their counterparts in first memory array device structure 110 and thus, are not repeated.

As shown in FIG. 1A, 3D memory device 100 can be further vertically-scalable by including a third memory array device structure 114 stacked above second memory array device structure 112. In some embodiments, third memory array device structure 114 includes a third single-crystal silicon layer 164 disposed above second array interconnect layer 156, a third memory stack 166 disposed above third single-crystal silicon layer 164, an array of third channel structures 168 each extending vertically through third memory stack 166 and into third single-crystal silicon layer 164, and a third array interconnect layer 172 disposed above third memory stack 166 and including a third bit line 174. A third bonding interface 162 can be formed between second array interconnect layer 156 and third single-crystal silicon layer 164 as a result of bonding third single-crystal silicon layer 164 onto second memory array device structure 112. Third single-crystal silicon layer 164, third memory stack 166, third channel structures 168, third array interconnect layer 172, and third bonding interface 162 are substantially similar to their counterparts in first and second memory array device structures 110 and 112 and thus, are not repeated.

In some embodiments, third single-crystal silicon layer 164 is transferred from the same donor substrate from which first single-crystal silicon layer 118 and/or second single-crystal silicon layer 148 are transferred to save wafer cost. It is understood that first, second, and third single-crystal silicon layers 118, 148 and 164 may be formed and transferred in parallel from three different donor substrates, respectively, to substrate 102 to further reduce fabrication cycle time in other embodiments. As a result of the de-bonding process performed again to bond third single-crystal silicon layer 164 onto second memory array device structure 112, third bonding interface 162 can be formed between second array interconnect layer 156 and third single-crystal silicon layer 164. In some embodiments, each third channel structure 168 includes a lower plug 170, such as a SEG plug, extending into third single-crystal silicon layer 164 as part of the source of the NAND memory string.

Lower plug 170 can be epitaxially grown from third single-crystal silicon layer 164 at the lower end of third channel structure 168 and include single-crystal silicon, the same material as third single-crystal silicon layer 164. Third single-crystal silicon layer 164 can thus work as the source layer of array of third channel structures 168.

In some embodiments, third array interconnect layer 172 includes third bit line 174 disposed above and electrically connected to third channel structure 168. The drain at the upper end of third channel structure 168 can be electrically connected to third bit line 174 through a bit line contact. Third bit line 174 can be electrically connected to peripheral device layer 104, such as a multiplexer, through a TSV 175 and the interconnects in peripheral interconnect layer 108. As a result, third channel structure 168 can be electrically connected to peripheral device layer 104 through third bit line 174. In some embodiments, a multiplexer in peripheral device layer 104 is configured to select one of first channel structure(s) 122, second channel structure(s) 152, and third channel structure(s) 168. First channel structure(s) 122, second channel structure(s) 152, and third channel structure(s) 168 share the same data buffer (e.g., the bit line page buffer) and/or driver (e.g., the word line driver) in peripheral device layer 104 by the multiplexer, according to some embodiments. Additional components of third memory array device structure 114, such as the slit structure, TAC, and local contacts, are substantially similar to their counterparts in first and second memory array device structures 110 and 112 and thus, are not repeated.

Although peripheral device layer 104 is disposed below memory array device structures 110, 112, and 114 in FIG. 1A, it is understood that the relative position of peripheral device layer 104 is not limited by the example in FIG. 1A and may be any other suitable positions, such as above memory array device structures 176, 184, and 192 in FIG. 1B. As shown in FIG. 1B, 3D memory device 100 can include first memory array device structure 176 disposed on substrate 102 without a peripheral device layer in-between. 3D memory device 100 can also include a second memory array device structure 184 disposed on first memory array device structure 176 with a first bonding interface 182 in-between. As described above with respect to the counterparts in FIG. 1A, second memory array device structure 184 can be formed by transferring a single-crystal silicon layer from another donor substrate to substrate 102 using a de-bonding process, followed by forming other components, such as the memory stack, channel structures, slit structure, TAC, local contacts, and the array interconnect layer, above the single-crystal silicon layer. 3D memory device 100 can further include a third memory array device structure 192 disposed on second memory array device structure 184 with a second bonding interface 191 in-between. Similarly, third memory array device structure 192 can be formed by transferring another single-crystal silicon layer from another donor substrate to substrate 102 using a de-bonding process, followed by forming other components above the other single-crystal silicon layer. The components in memory array device structures 176, 184, and 192 in FIG. 1B are substantially similar to their counterparts in memory array device structures 110, 112, and 114 and thus, are not repeated.

As shown in FIG. 1B, 3D memory device 100 includes a single-crystal silicon layer 196 disposed above memory array device structures 176, 184, and 192. In some embodiments, single-crystal silicon layer 196 is transferred from another donor substrate to substrate 102 using a de-bonding process as described herein in detail. As a result of the de-bonding process performed to bond single-crystal silicon layer 196 onto third memory array device structure 192, a third bonding interface 195 can be formed between third memory array device structure 192 and single-crystal silicon layer 196. Single-crystal silicon layer 196 can include single-crystal silicon, for example, can be fully made of single-crystal silicon, which has superior electric performances (e.g., higher carrier mobility) than silicon in other forms, such as polysilicon or amorphous silicon. In some embodiments, single-crystal silicon layer 196 includes compound materials formed from single-crystal silicon, such as metal silicides that have silicon with metal elements including, but not limited to, titanium silicide, cobalt silicide, nickel silicide, tungsten silicide, etc. In some embodiments, the thickness of single-crystal silicon layer 196 is between about 1 μm and about 100 μm, such as between 1 μm and 100 μm (e.g., 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, any range bounded by the lower end by any of these values, or any range defined by any two of these values).

In some embodiments, 3D memory device 100 includes a peripheral device layer 197 on single-crystal silicon layer 196. Peripheral device layer 197 can be formed "on" single-crystal silicon layer 196, in which the entirety or part of peripheral device layer 197 is formed in single-crystal silicon layer 196 (e.g., below the top surface of single-crystal silicon layer 196) and/or directly on single-crystal silicon layer 196. Peripheral device layer 197 can include a plurality of transistors formed on single-crystal silicon layer 196. Isolation regions (e.g., STIs) and doped regions (e.g., source regions and drain regions) of the transistors can be formed in single-crystal silicon layer 196 as well. 3D memory device 100 can further include an interconnect layer (also referred to herein as a "peripheral interconnect layer" 198) above peripheral device layer 197 to transfer electrical signals to and from peripheral device layer 197. Peripheral interconnect layer 198 can include a plurality of MEOL or BEOL interconnects. Peripheral device layer 197 and peripheral interconnect layer 198 in FIG. 1B are substantially slimier to their counterparts in FIG. 1A and thus, are not repeated.

In some embodiments, first memory array device structure 176 includes a first array interconnect layer 178 including a first bit line 180 disposed above and electrically connected to the channel structures of first memory array device structure 176. First bit line 180 can be electrically connected to peripheral device layer 197, such as a multiplexer, through a TSV and the interconnects in peripheral interconnect layer 198. Similarly, second memory array device structure 184 includes a second array interconnect layer 188 including a second bit line 190 disposed above and electrically connected to the channel structures of second memory array device structure 184. Second bit line 190 can be electrically connected to peripheral device layer 197, such as a multiplexer, through a TSV and the interconnects in peripheral interconnect layer 198. Similarly, third memory array device structure 192 includes a third array interconnect layer 193 including a third bit line 194 disposed above and electrically connected to the channel structures of third memory array device structure 192. Third bit line 194 can be electrically connected to peripheral device layer 197, such as a multiplexer, through a TSV and the interconnects in peripheral interconnect layer 198. As a result, the channel structures in first, second, third memory array device structures 176, 184, and 192 can be electrically connected to peripheral device layer 197 through first, second, and third bit lines 180, 190, and 194, respectively. Peripheral device layer 197 is disposed above each of first, second, and third array interconnect layers 178, 188, and 193 (and first, second, and third bit lines 180, 190, and 194 therein), according to some embodiments.

Although not shown, it is understood that the peripheral device layer in 3D memory device 100 can be immediately between two of the memory array device structures, but not on the same level as any one of the memory array device structures. That is, the peripheral device layer can be formed on a single-crystal silicon layer dedicated to the peripheral device layer and not shared by a memory array device structure. It is further understood that the peripheral device layer in 3D memory device 100 may be on the same single-crystal silicon layer (or substrate 102) shared by a memory array device structure in other embodiments. That is, the peripheral device layer can be formed on the same level as the memory array device structure and beside the memory stack of the memory array device structure. The level on which both the peripheral device and the memory stack are disposed can be the bottom level (i.e., on substrate 102), the top level, or any middle level of multi-stack 3D memory device 100.

For example, as shown in FIG. 1C, a peripheral device layer 115 and a memory stack 107 can be both disposed on a same single-crystal silicon layer 105 (as part of a memory array device structure 103) in the middle level of 3D memory device 100. In some embodiments, peripheral device layer 115 is on single-crystal silicon layer 105 and beside memory stack 107. As shown in FIG. 1C, 3D memory device 100 can further include memory array device structure 176 between substrate 102 and memory array device structure 103, and another memory array device structure 114 above memory array device structure 103. The details of memory array device structures 114 and 176 are described above with respect to FIGS. 1A and 1B and thus, are not repeated.

In some embodiments, single-crystal silicon layer 105 is transferred from another donor substrate to substrate 102 using a de-bonding process as described herein in detail. As a result of the de-bonding process performed to bond single-crystal silicon layer 105 onto memory array device structure 176, a first bonding interface 123 can be formed between memory array device structure 176 and single-crystal silicon layer 105. Single-crystal silicon layer 105 can include single-crystal silicon, for example, can be fully made of single-crystal silicon, which has superior electric performances (e.g., higher carrier mobility) than silicon in other forms, such as polysilicon or amorphous silicon. In some embodiments, single-crystal silicon layer 105 includes compound materials formed from single-crystal silicon, such as metal silicides that have silicon with metal elements including, but not limited to, titanium silicide, cobalt silicide, nickel silicide, tungsten silicide, etc. In some embodiments, the thickness of single-crystal silicon layer 105 is between about 1 μm and about 100 μm, such as between 1 μm and 100 μm (e.g., 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, any range bounded by the lower end by any of these values, or any range defined by any two of these values). In some embodiments, as the base on which both memory stack 107 and peripheral device layer 115 can form, single-crystal silicon layer 105 extends laterally along the width greater than the width of memory stack 107 (e.g., in the x-direction as shown in FIG. 1C) to fit both memory stack 107 and peripheral device layer 115.

Peripheral device layer 115 can include a plurality of transistors 117 formed on single-crystal silicon layer 105 beside memory stack 107. Isolation regions (e.g., STIs) and doped regions (e.g., source regions and drain regions) of transistors 117 can be formed in single-crystal silicon layer 105 as well. 3D memory device 100 can further include a peripheral interconnect layer to transfer electrical signals to and from peripheral device layer 115. Peripheral device layer 115 and the peripheral interconnect layer in FIG. 1C are substantially slimier to their counterparts in FIG. 1A and thus, are not repeated.

Memory array device structure 103 can further include an array of channel structures 109 each extending vertically through memory stack 107 and into single-crystal silicon layer 105 (e.g., by a respective SEG plug at its lower end). Memory array device structure 103 can further include an array interconnect layer 111 including a bit line 113 above memory stack 107 and electrically connected to channel structure 109. Bit line 113 can be electrically connected to peripheral device layer 115 through a via contact 119. A second bonding interface 125 can be formed between array interconnect layer 111 of memory array device structure 103 and single-crystal silicon layer 164 of memory array device structure 114.

Figure 2:
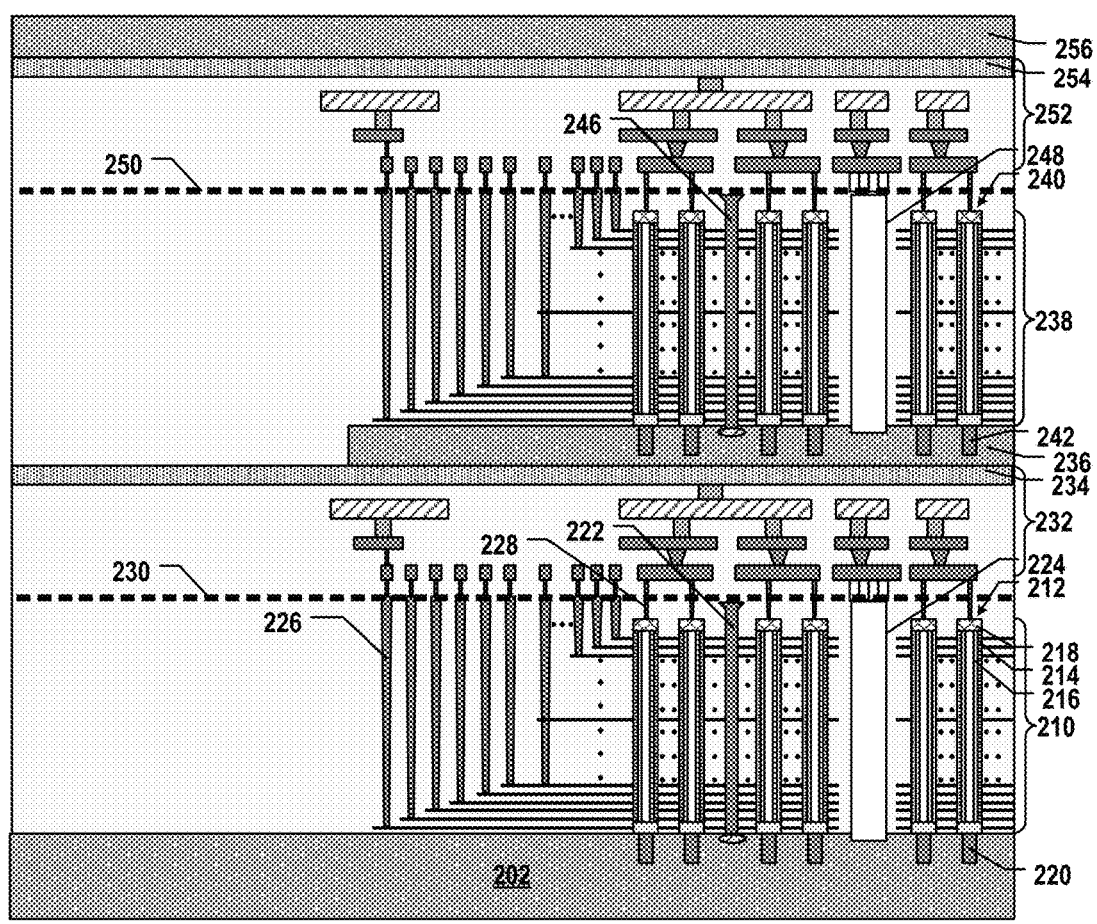
FIG. 2 illustrates a cross-section of an exemplary multi-stack 3D memory device having transferred interconnect layers, according to some embodiments of the present disclosure.
Figure 2:

FIG. 2 illustrates a cross-section of an exemplary multi-stack 3D memory device 200 having transferred interconnect layers, according to some embodiments of the present disclosure. In FIGS. 1A-1C, each interconnect layer of 3D memory device 100 is formed monolithically above a respective memory stack or peripheral device layer by depositions of interconnects and ILD layers. It is understood that an interconnect layer (including a bit line) may be formed non-monolithically as a dedicated wafer slice and transferred from another donor substrate to 3D memory device 200 using the de-bonding process described herein in detail. As a result, the fabrication cycle of 3D memory device 200 can be reduced by forming multiple interconnect layers in parallel from different donor substrates. It is understood that the details of similar structures (e.g., materials, fabrication process, functions, etc.) in both 3D memory devices 100 and 200 may not be repeated below.

As shown in FIG. 2, 3D memory device 200 can include a substrate 202, which can include silicon (e.g., single-crystal silicon), SiGe, GaAs, Ge, SOI, or any other suitable materials. In some embodiments, 3D memory device 200 is a NAND Flash memory device in which memory cells are provided in the form of an array of NAND memory strings, for example, an array of first channel structures 212 each extending vertically through a first memory stack 210 having a first plurality of interleaved conductor layers and dielectric layers above substrate 202. Each first channel structure 212 can include a composite dielectric layer (also known as a "memory film" 214) and a semiconductor channel 216. In some embodiments, semiconductor channel 216 includes silicon, such as amorphous silicon, polysilicon, or single-crystal silicon.

In some embodiments, memory film 214 includes a tunneling layer, a storage layer (also known as "charge trap layer"), and a blocking layer. Memory film 214 and semiconductor channel 216 are formed along the sidewall of first channel structure 212, according to some embodiments. Each first channel structure 212 can include an upper plug 218 at its upper end and lower plug 220 at its lower end. In some embodiments, upper plug 218 includes semiconductor materials, such as polysilicon, and works as the drain of first channel structure 212. In some embodiments, lower plug 220 extends into substrate 202, i.e., below the top surface of substrate 202. Lower plug 220 includes semiconductor materials, such as single-crystal silicon, and works as part of the source of first channel structure 212, according to some embodiments.

In some embodiments, 3D memory device 200 further includes a slit structure 222 (e.g., a GLS) that extends vertically through first memory stack 210 to substrate 202 and works as a source conductor in contact with substrate 202 for electrically controlling an ACS of first channel structures 212. 3D memory device 200 can further include a TAC 224 extending vertically through first memory stack 210. In some embodiments, 3D memory device 200 further includes local contacts to be electrically connected to first channel structures 212, such as bit line contacts 228 and word line contacts 226.

As shown in FIG. 2, 3D memory device 200 can further include a first array interconnect layer 232 above first memory stack 210 and first channel structures 212. First array interconnect layer 232 can transfer electrical signals to and from first channel structures 212. First array interconnect layer 232 includes a plurality of interconnects, such as a first bit line 234, formed in one or more ILD layers, according to some embodiments. Difference from the array interconnect layer of 3D memory device 100 in FIGS. 1A-1C that are formed monolithically above the underneath memory stack (e.g., by depositions of interconnects and ILD layers), first array interconnect layer 232 of 3D memory device 100 is formed non-monolithically on a different donor substrate and transferred onto first memory stack 210 using a de-bonding process. As a result of the bonding, a first bonding interface 230 can be disposed between first array interconnect layer 232 and underneath first memory stack 210, which is different from the bonding interface of 3D memory device 100 in FIGS. 1A-1C that is disposed between the single-crystal silicon layer and the underneath array interconnect layer.

In some embodiments, 3D memory device 200 further includes a first single-crystal silicon layer 236 disposed on first array interconnect layer 232. First single-crystal silicon layer 236 can be monolithically formed with first array interconnect layer 232 on the same donor substrate and then transferred together with first array interconnect layer 232 from the donor substrate. As a result, there is no bonding interface between first single-crystal silicon layer 236 and underneath first array interconnect layer 232 in 3D memory device 200, according to some embodiments. As described above, in some embodiments, first single-crystal silicon layer 236 is disposed directly on first bit line 234 in first array interconnect layer 232 without a passivation layer (e.g., an ILD layer) in-between. First single-crystal silicon layer 236 can include a well between first array interconnect layer 232 and a second memory stack 238 with any suitable dopants at a desired doping level to reduce electric coupling and leakage between first array interconnect layer 232 and second memory stack 238. It is understood that a passivation layer (not shown) may be formed between first single-crystal silicon layer 236 and first bit line 234 in first array interconnect layer 232 in other embodiments. For example, first bit line 234 may be disposed in one or more ILD layers including a passivation layer thereon.

First single-crystal silicon layer 236 can include single-crystal silicon, for example, can be fully made of single-crystal silicon, which has superior electric performances (e.g., higher carrier mobility) than silicon in other forms, such as polysilicon or amorphous silicon. In some embodiments, first single-crystal silicon layer 236 includes compound materials formed from single-crystal silicon, such as metal silicides that have silicon with metal elements including, but not limited to, titanium silicide, cobalt silicide, nickel silicide, tungsten silicide, etc. In some embodiments, the thickness of first single-crystal silicon layer 236 is between about 1 μm and about 100 μm, such as between 1 μm and 100 μm (e.g., 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, any range bounded by the lower end by any of these values, or any range defined by any two of these values). In some embodiments, as the base on which second memory stack 238 can form, first single-crystal silicon layer 236 extends laterally along at least the width of second memory stack 238 (e.g., in the x-direction as shown in FIG. 2). It is understood that the initial lateral dimensions of first single-crystal silicon layer 236 may be determined by the lateral dimensions of the donor substrate from which first single-crystal silicon layer 236 is transferred and may be changed after being bonded above first memory stack 210 for example, by patterning and etching first single-crystal silicon layer 236.

Similar to 3D memory device 100, 3D memory device 200 can be vertically-scalable by forming second memory stack 238 and array of second channel structures 240 therethrough on first single-crystal silicon layer 236. Second memory stack 238 includes a second plurality of interleaved conductor layers and dielectric layers above first single-crystal silicon layer 236, according to some embodiments. In some embodiments, second channel structure 240 extends vertically through second memory stack 238 and includes a lower plug 242, such as a SEG plug, extending into first single-crystal silicon layer 236. Lower plug 242 can be epitaxially grown from first single-crystal silicon layer 236 at the lower end of second channel structure 240 and include single-crystal silicon, the same material as first single-crystal silicon layer 236. First single-crystal silicon layer 236 can thus work as the source layer of array of second channel structures 240.

In some embodiments, 3D memory device 200 further includes another slit structure 246 and another TAC 248 each extending vertically through second memory stack 238 to first single-crystal silicon layer 236. Slit structure 246 and TAC 248 are substantially similar to slit structure 222 and TAC 224 and thus, are not repeated. In some embodiments, 3D memory device 200 further includes a second array interconnect layer 252 including a second bit line 254 and a second boning interface 250 between second memory stack 238 and second array interconnect layer 252. 3D memory device 200 can further include a second single-crystal silicon layer 256 on second array interconnect layer 252. Similar to first array interconnect layer 232 and first single-crystal silicon layer 236, second array interconnect layer 252 and second single-crystal silicon layer 256 can be formed monolithically on the same donor substrate and then transferred together onto second memory stack 238 using a de-bonding process. The donor substrate on which second array interconnect layer 252 and second single-crystal silicon layer 256 are formed may be the same as the donor substrate on which first array interconnect layer 232 and first single-crystal silicon layer 236 are formed in order to reduce wafer cost, or may be different from the donor substrate on which first array interconnect layer 232 and first single-crystal silicon layer 236 are formed in order to achieve parallel processing to shorten cycle time.

Although FIG. 2 does not show a peripheral device layer, it is understood that a peripheral device layer can be disposed in any suitable position in a multi-stack 3D memory device as described above with respect to FIGS. 1A-1C. It is further understood that the number of memory stacks and array of channel structures therethrough is not limited by the example shown in FIG. 2 since 3D memory device 200 is vertically-scalable by transferring any suitable number of array interconnect layers along with single-crystal silicon layers from one or more donor to substrate 202.

Figure 3:
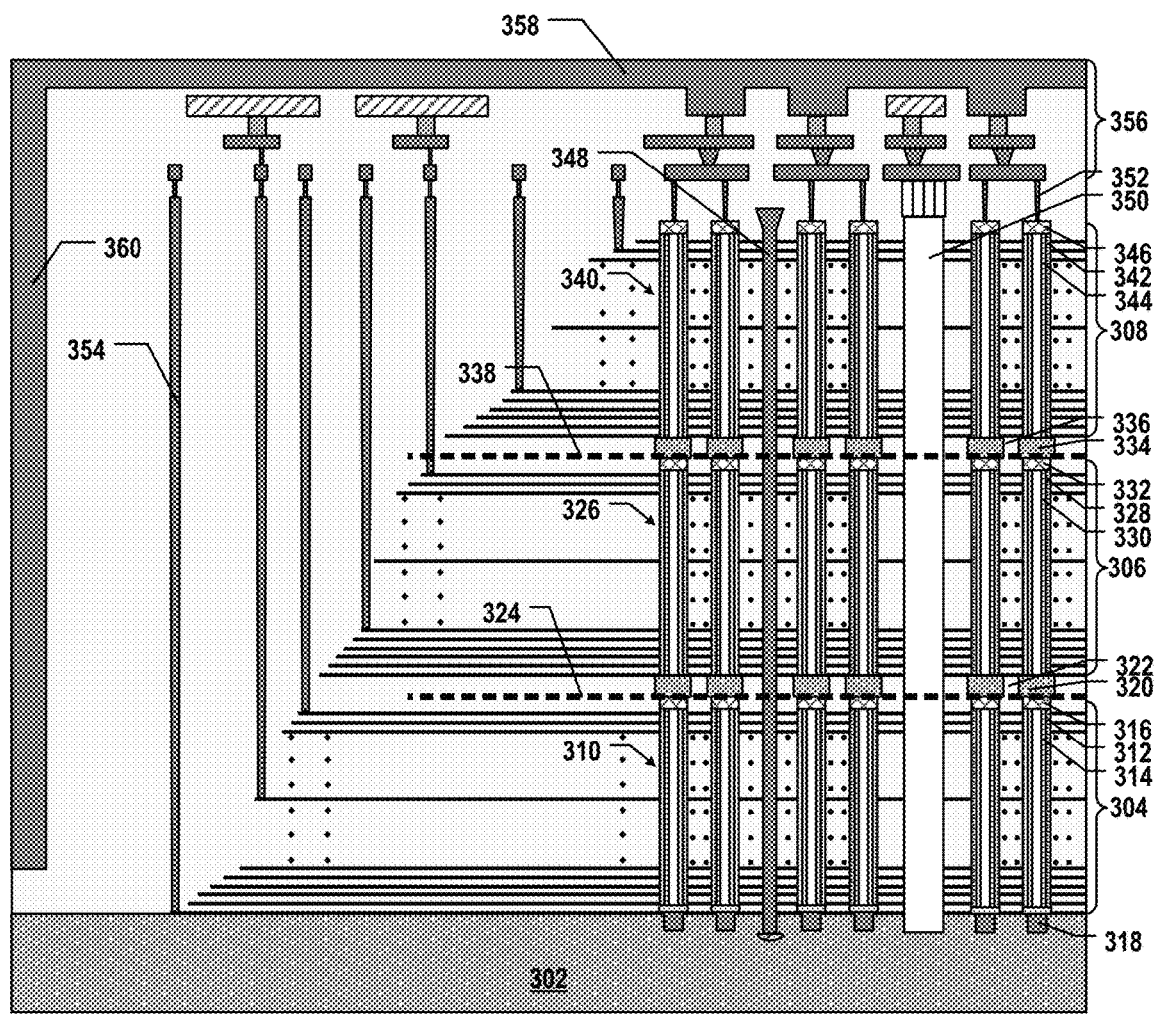
FIG. 3 illustrates a cross-section of an exemplary multi-deck 3D memory device, according to some embodiments of the present disclosure.

To further increase cell density by increasing the number of levels in a memory stack without sacrificing production yield, a memory stack of a 3D memory device may include multiple memory decks stacked together, such that a longer NAND memory string can be achieved by connecting multiple channel structures vertically, each of which extends vertically through a respective one of the multiple memory decks. A 3D memory device having a multi-deck architecture is referred to herein as a "multi-deck 3D memory device." It is understood that a multi-stack 3D memory device (e.g., 3D memory devices 100 and 200 in FIGS. 1A-1C and 2) may be a multi-deck 3D memory device as well so long as at least one of the memory stacks includes more than one memory deck. FIG. 3 illustrates a cross-section of an exemplary multi-deck 3D memory device 300, according to some embodiments of the present disclosure. It is understood that although FIG. 3 shows a single memory stack having multiple memory decks in 3D memory device 300, the multi-deck architecture can be expanded to any number of memory stacks. It is also understood that the memory stack having multiple memory decks can be at the bottom (e.g., as shown in FIG. 3), in the middle, or at the top of a multi-stack architecture. It is further understood that the details of similar structures (e.g., materials, fabrication process, functions, etc.) in both 3D memory devices 100 and 300 may not be repeated below.

As shown in FIG. 3, 3D memory device 300 can include a substrate 302, which can include silicon (e.g., single-crystal silicon), SiGe, GaAs, Ge, SOI, or any other suitable materials. In some embodiments, 3D memory device 300 is a NAND Flash memory device in which memory cells are provided in the form of an array of NAND memory strings. In some embodiments, each NAND memory string includes a plurality of channel structures in contact with one another in the vertically direction. The channel structures in a NAND memory string can be electrically connected to inter-deck plugs including single-crystal silicon, which has superior electric performances (e.g., higher carrier mobility) than silicon in other forms, such as polysilicon or amorphous silicon. Each channel structure of a NAND memory string can extend vertically through a respective one of a plurality of stacked memory decks (together forming a memory stack).

For example, as shown in FIG. 3, 3D memory device 300 can include a first memory deck 304 disposed above substrate 302. First memory deck 304 includes a first plurality of conductor/dielectric layer pairs, i.e., interleaved conductor layers and dielectric layers. In some embodiments, 3D memory device 300 includes an array of first channel structures 310 each extending vertically through first memory deck 304. Each first channel structure 310 can include a composite dielectric layer (also known as a "memory film" 312) and a semiconductor channel 314. In some embodiments, semiconductor channel 314 includes silicon, such as amorphous silicon, polysilicon, or single-crystal silicon. In some embodiments, memory film 312 includes a tunneling layer, a storage layer (also known as "charge trap layer"), and a blocking layer. Memory film 312 and semiconductor channel 314 are formed along the sidewall of first channel structure 310, according to some embodiments. Each first channel structure 310 can have a cylinder shape (e.g., a pillar shape). Semiconductor channel 314, the tunneling layer, the storage layer, and the blocking layer of memory film 312 are arranged along the radial direction from the center toward the outer surface of the pillar in this order, according to some embodiments.

In some embodiments, each first channel structure 310 can include an upper plug 316 at its upper end and a lower plug 318 at its lower end. That is, semiconductor channel 314 is disposed vertically between and in contact with upper plug 316 and lower plug 318, respectively, according to some embodiments. In some embodiments, upper plug 316 includes semiconductor materials, such as polysilicon, and is above and in contact with semiconductor channel 314. For example, both upper plug 316 and semiconductor channel 314 can include polysilicon and are electrically connected. It is understood that first channel structure 310 may not include upper plug 316 in other embodiments. In some embodiments, lower plug 318 extends into substrate 302, i.e., below the top surface of substrate 302. Lower plug 318 includes semiconductor materials and works as part of the source of a respective NAND memory string (with first channel structure 310 at the bottom), according to some embodiments. In some embodiments, lower plug 318 is a SEG plug epitaxially-grown from substrate 302 at the lower end of first channel structure 310. As a SEG plug, lower plug 318 includes the same material as substrate 302, e.g., single-crystal silicon, according to some embodiments.

As shown in FIG. 3, 3D memory device 300 can include a plurality of first inter-deck plugs 320 each disposed above and in contact with respective first channel structure 310. In some embodiments, 3D memory device 300 also includes dielectrics 322 that surround first inter-deck plugs 320 for electrically isolating adjacent first inter-deck plugs 320. Dielectrics 322 can include, but not limited to, silicon oxide, silicon nitride, silicon oxynitride, low-k dielectrics, or any combination thereof. In some embodiments, first inter-deck plugs 320 are patterned in a first single-crystal silicon layer that is transferred from another donor substrate other than substrate 302 and bonded onto first memory deck 304 using a de-bonding process disclosed herein. As a result, 3D memory device 300 can also include a first bonding interface 324 between first memory deck 304 and first inter-deck plugs 320. First inter-deck plug 320 can include single-crystal silicon, for example, can be fully made of single-crystal silicon, which has superior electric performances (e.g., higher carrier mobility) than silicon in other forms, such as polysilicon or amorphous silicon. In some embodiments, first inter-deck plug 320 includes compound materials formed from single-crystal silicon, such as metal silicides that have silicon with metal elements including, but not limited to, titanium silicide, cobalt silicide, nickel silicide, tungsten silicide, etc. Since single-crystal silicon has superior electric performances (e.g., higher carrier mobility) compared with polysilicon, first inter-deck plugs 320 including single-crystal silicon can increase cell storage capacity with better cell performance of 3D memory device 300, in particular, at the inter-deck joint position.

In some embodiments in which first channel structure 310 includes upper plug 316 (e.g., as shown in FIG. 3), first inter-deck plug 320 is above and in contact with upper plug 316 of first channel structure 310. First inter-deck plug 320 and upper plug 316 together may be viewed as a semiconductor plug having both single-crystal silicon (in first inter-deck plug 320) and polysilicon (in upper plug 316). In some embodiments in which first channel structure 310 does not include upper plug 316 (not shown), first inter-deck plug 320 is above and in contact with semiconductor channel 314 of first channel structure 310. Nevertheless, each first inter-deck plug 320 can be electrically connected to semiconductor channel 314 of respective first channel structure 310. In some embodiments, the thickness of first inter-deck plug 320 is between about 1 µm and about 100 µm, such as between 1 µm and 100 µm (e.g., 1 µm, 2 µm, 3 µm, 4 µm, 5 µm, 6 µm, 7 µm, 8 µm, 9 µm, 10 µm, 15 µm, 20 µm, 25 µm, 30 µm, 35 µm, 40 µm, 45 µm, 50 µm, 55 µm, 60 µm, 65 µm, 70 µm, 75 µm, 80 µm, 85 µm, 90 µm, 95 µm, 100 µm, any range bounded by the lower end by any of these values, or any range defined by any two of these values). First inter-deck plugs 320 and dielectrics 322 are formed in the same layer and thus, have nominally the same thickness, according to some embodiments.

As described above, 3D memory device 300 having a multi-deck architecture is vertically-scalable by cascading more memory decks and channel structures on top of first memory deck 304 and first channel structures 310 through first inter-deck plugs 320. As shown in FIG. 3, 3D memory device 300 can further include a second memory deck 306 including a second plurality of interleaved conductor layers and dielectric layers above first inter-deck plugs 320. In some embodiments, 3D memory device 300 includes an array of second channel structures 326 each extending vertically through second memory deck 306. Each second channel structure 326 is above and in contact with respective first inter-deck plug 320, such that each second channel structure 326 is electrically connected to respective first channel structure 310 through respective first inter-deck plug 320, according to some embodiments. That is, each second channel structure 326 can be aligned with respective first inter-deck plug 320 and electrically connected to respective first channel structure 310. As a result, first and second channel structures 310 and 326 become parts of a NAND memory string with an increased number of memory cells.

Similar to first channel structures 310, each second channel structure 326 can include a memory film 328 and a semiconductor channel 330. In some embodiments, semiconductor channel 330 includes silicon, such as amorphous silicon, polysilicon, or single-crystal silicon. In some embodiments, memory film 328 includes a tunneling layer, a storage layer (also known as "charge trap layer"), and a blocking layer. Memory film 328 and semiconductor channel 330 are formed along the sidewall of second channel structure 326, according to some embodiments. First inter-deck plugs 320 and surrounding dielectrics 322 can be in the same layer that is vertically between first and second memory decks 304 and 306. In some embodiments, semiconductor channel 330 of second channel structure 326 is above and in contact with first inter-deck plug 320, which is electrically connected to semiconductor channel 314 of first channel structure 310 underneath. As a result, each semiconductor channel 330 of second channel structure 326 can be electrically connected to semiconductor channel 314 of respective first channel structure 310 through respective first inter-deck plug 320 including single-crystal silicon.

3D memory device 300 can further include second inter-deck plugs 334 above second memory deck 306 to continuously cascade more channel structures. Similar to first inter-deck plugs 320, second inter-deck plugs 334 can be electrically isolated by surrounding dielectrics 336 and include single-crystal silicon. In some embodiments, second inter-deck plugs 334 are patterned in a second single-crystal silicon layer that is transferred from another donor substrate and bonded onto second memory deck 306 using a de-bonding process disclosed herein. The donor substrate from which the second single-crystal silicon layer is transferred can be the same as the donor substrate from which the first single-crystal silicon layer is transferred in order to save wafer cost. The donor substrate from which the second single-crystal silicon layer is transferred can be different from the donor substrate from which the first single-crystal silicon layer is transferred in order to allow parallel processing to shorten cycle time. Nevertheless, as a result, 3D memory device 300 can also include a second bonding interface 338 between second memory deck 306 and second inter-deck plugs 334.

Similar to first channel structure 310, second channel structure 326 can include an upper plug 332 including polysilicon at an upper end thereof and in contact with semiconductor channel 330 of second channel structure 326 (e.g., as shown in FIG. 3). Each second inter-deck plug 334 thus can be above and in contact with upper plug 332 of respective second channel structure 326 to form electrical connections. In some embodiments, second inter-deck plug 334 and upper plug 332 together may be viewed as a semiconductor plug having both single-crystal silicon (in second inter-deck plug 334) and polysilicon (in upper plug 332). It is understood that second channel structure 326 may not include upper plug 332 in other embodiments, such that each second inter-deck plug 334 is above and in contact directly with semiconductor channel 330 of respective second channel structure 326 to form electrical connections.

3D memory device 300 can further include a third memory deck 308 including a third plurality of interleaved conductor layers and dielectric layers above second inter-deck plugs 334. In some embodiments, 3D memory device 300 includes an array of third channel structures 340 each extending vertically through third memory deck 308. Similar to second channel structures 326, each third channel structure 340 can include a memory film 342 and a semiconductor channel 344 along the sidewall of third channel structure 340 as well as an upper plug 346 at the upper end thereof. Each upper plug 346 can work as the source of a respective NAND memory string as it is at the upper end of third channel structure 340 above first and second channel structures 310 and 326. Each third channel structure 340 is above and in contact with respective second inter-deck plug 334, such that each third channel structure 340 is electrically connected to respective first and second channel structures 310 and 326 through respective first and second inter-deck plug 320 and 334, according to some embodiments. That is, each third channel structure 340 can be aligned with respective second inter-deck plug 334 and electrically connected to respective first and second channel structures 310 and 326. As a result, first, second, and third channel structures 310, 326, and 340 together form a NAND memory string with an increased number of memory cells.

In some embodiments, 3D memory device 300 further includes a slit structure 348 (e.g., a GLS) that extends vertically through first, second, and third memory decks 304, 306, and 308 to substrate 302. Slit structure 348 can be used to form the conductor/dielectric layer pairs in first, second, and third memory decks 304, 306, and 308 by a gate replacement process. In some embodiments, slit structure 348 is firstly filled with dielectric materials, for example, silicon oxide, silicon nitride, or any combination thereof, for separating array of the NAND memory strings into different regions (e.g., memory fingers and/or memory blocks). Then, slit structure 348 can be filled with conductive and/or semiconductor materials, for example, W, Co, polysilicon, or any combination thereof as a source conductor in contact with substrate 302 for electrically controlling an ACS.

In some embodiments, 3D memory device 300 further includes a TAC 350 extending vertically through first, second, and third memory decks 304, 306, and 308 to substrate 302. TAC 350 can carry electrical signals from and/or to first, second, and third memory decks 304, 306, and 308, such as part of the power bus, with shortened interconnect routing. TAC 350 can also provide mechanical support to first, second, and third memory decks 304, 306, and 308. In some embodiments, TAC 350 is filled with conductive materials, including, but not limited to, W, Co, Cu, Al, doped silicon, silicides, or any combination thereof.

In some embodiments, first, second, and third memory decks 304, 306, and 308 each includes a staircase structure at one side thereof in the lateral direction to fan-out the word lines. 3D memory device 300 further includes an array interconnect layer 356 and local contacts, such as bit line contacts 352 and word line contacts 354, to electrically connect first, second, and third channel structures 310, 326, and 340 to array interconnect layer 356, according to some embodiments. Array interconnect layer 356 can be disposed above first, second, and third memory decks 304, 306, and 308 to transfer electrical signals to and from first, second, and third channel structures 310, 326, and 340. In some embodiments, array interconnect layer 356 includes a bit line 358 disposed above and electrically connected to first, second, and third channel structures 310, 326, and 340. The drain at the upper end of third channel structure 340, e.g., upper plug 346, can be electrically connected to bit line 358 through bit line contact 352. Bit line 358 can be electrically connected to a peripheral device layer (not shown) through a TSV 360. Although the peripheral device layer is not shown in FIG. 3, it is understood that a peripheral device layer can be disposed in any suitable position in 3D memory device 300 as described above with respect to FIGS. 1A-1C. Array interconnect layer 356 and bit line 358 therein can be formed monolithically above third memory deck 308 without a bonding interface therebetween (e.g., as shown in FIG. 3). It is understood that array interconnect layer 356 and bit line 358 therein may be formed non-monolithically on a different donor substrate and then transferred onto third memory deck 308 using a de-bonding process as described above with respect to FIG. 2.

Figure 7:
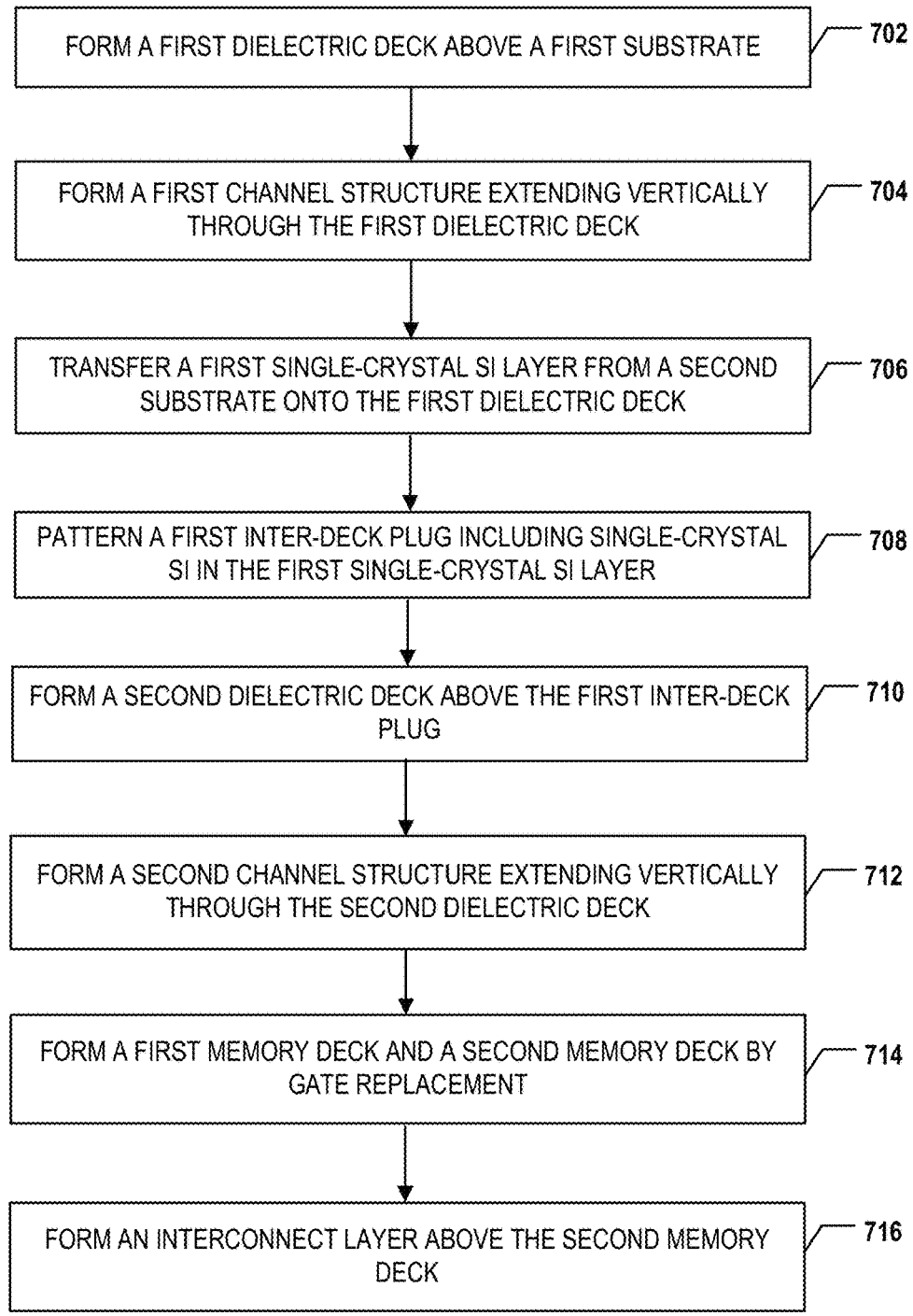
FIG. 7 is a flowchart of an exemplary method for forming a multi-deck 3D memory device, according to some embodiments of the present disclosure.

FIGS. 4A-4J illustrate an exemplary fabrication process for forming a multi-deck 3D memory device, according to some embodiments of the present disclosure. FIG. 7 is a flowchart of an exemplary method 700 for forming a multi-deck 3D memory device, according to some embodiments of the present disclosure. Examples of the 3D memory device depicted in FIGS. 4A-4J and 7 include 3D memory device 300 depicted in FIG. 3. FIGS. 4A-4J and 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7.

Figure 4A:
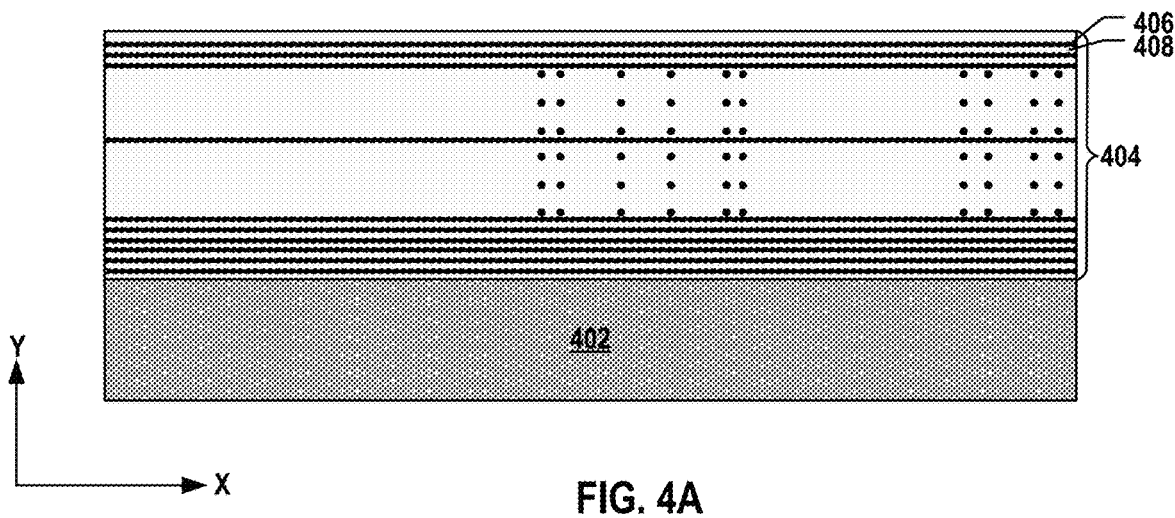
FIGS. 4A-4J illustrate an exemplary fabrication process for forming a multi-deck 3D memory device, according to some embodiments of the present disclosure.

Referring to FIG. 7, method 700 starts at operation 702, in which a first dielectric deck is formed above a first substrate. The first dielectric deck can include a first plurality of interleaved sacrificial layers and dielectric layers. The first substrate can be a silicon substrate. As illustrated in FIG. 4A, a first dielectric deck 404 is formed above a first silicon substrate 402. In some embodiments, an insulation layer (not shown) is formed between first silicon substrate 402 and first dielectric deck 404. To form first dielectric deck 404, first dielectric layers (known as a "sacrificial layer" 406) and second dielectric layers 408 that are different from sacrificial layer 406 can be alternatively deposited above first silicon substrate 402 using one or more thin film deposition processes including, but not limited to, chemical vapor deposition (CVD), physical vapor deposition (PVD), atomic layer deposition (ALD), any other suitable processes, or any combination thereof. In some embodiments, each sacrificial layer 406 includes silicon nitride, and each dielectric layer 408 includes silicon oxide.

Method 700 proceeds to operation 704, as illustrated in FIG. 7, in which a first channel structure extending vertically through the first dielectric deck is formed. To form the first channel structure, a first channel hole is etched through the first dielectric deck, and a first memory film and a first semiconductor channel are subsequently deposited along a sidewall of the first channel hole, according to some embodiments. In some embodiments, an upper plug including polysilicon is further formed at an upper end of the first channel hole.

Figure 4B:
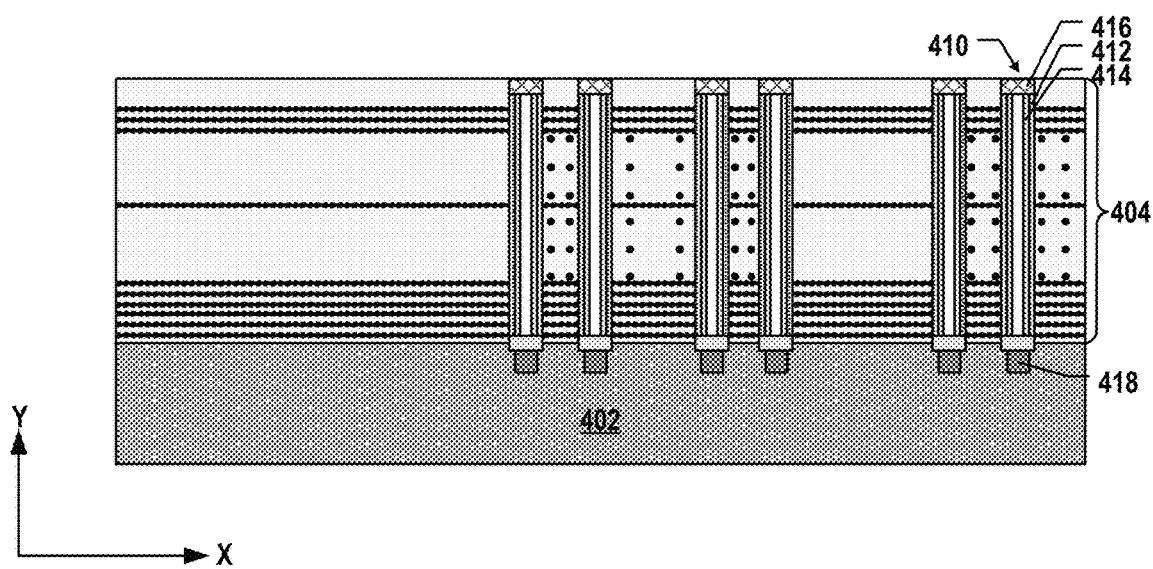

As illustrated in FIG. 4B, first channel structures 410 each extending vertically through first dielectric deck 404 are formed above first silicon substrate 402. For each first channel structure 410, a first channel hole (not shown) is first etched through interleaved sacrificial layers 406 and dielectric layers 408 of first dielectric deck 404 using one or more dry etch processes and/or wet etch processes, such as deep reactive-ion etch (RIE), according to some embodiments. The first channel hole can be continuously etched into the upper portion of first silicon substrate 402. In some embodiments, a lower plug 418, e.g., a SEG plug, of first channel structure 410 is formed using epitaxial growth processes from first silicon substrate 402 to fill the lower portion of the first channel hole. The fabrication processes for epitaxially growing lower plug 418 can include, but not limited to, vapor-phase epitaxy (VPE), liquid-phase epitaxy (LPE), molecular-beam epitaxy (MBE), or any combinations thereof.

As illustrated in FIG. 4B, after forming lower plug 418, a memory film 412 and a semiconductor channel 414 can be subsequently deposited along the sidewall of the first channel hole. In some embodiments, a blocking layer, a storage layer, and a tunneling layer are subsequently deposited in this order using one or more thin film deposition processes, such as ALD, CVD, PVD, any other suitable processes, or any combination thereof, to form memory film 412. Semiconductor channel 414 can then be deposited on the tunneling layer using one or more thin film deposition processes, such as ALD, CVD, PVD, any other suitable processes, or any combination thereof. In some embodiments, memory film 412 and semiconductor channel 414 are deposited on lower plug 418 at the bottom of the first channel as well, and semiconductor channel 414 is in contact with lower plug 418 using a SONO punch process. In some embodiments, a capping layer is filled in the remaining space of the first channel hole by depositing dielectric materials such as silicon oxide after the deposition of semiconductor channel 414.

As illustrated in FIG. 4B, after forming memory film 412 and semiconductor channel 414, an upper plug 416 is formed at the upper end of the first channel hole. In some embodiments, parts of memory film 412 and semiconductor channel 414 at the upper end of the first channel hole can be removed by chemical mechanical polishing (CMP), grinding, wet etching, and/or dry etching to form a recess at the upper end of the first channel hole. Upper plug 416 then can be formed by depositing semiconductor materials, such as polysilicon, into the recess by one or more thin film deposition processes, such as CVD, PVD, ALD, electroplating, electroless plating, or any combination thereof. First channel structure 410 is thereby formed. It is understood that first channel structure 410 may not include upper plug 416 in other embodiments, and the process for forming upper plug 416 can be skipped.

Figure 8:
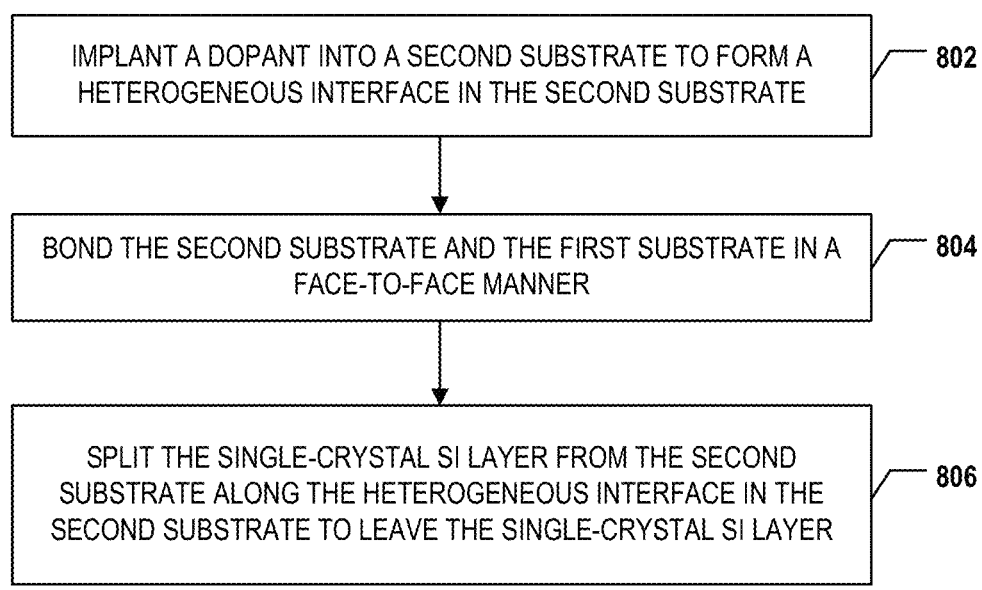
FIG. 8 is a flowchart of an exemplary method for transferring a single-crystal silicon layer, according to some embodiments of the present disclosure.

Method 700 proceeds to operation 706, as illustrated in FIG. 7, in which a first single-crystal silicon layer is transferred from a second substrate (a "donor substrate") onto the first dielectric deck above the first substrate, for example, using a de-bonding process. The second substrate is a silicon substrate. FIG. 8 is a flowchart of an exemplary method 800 for transferring a single-crystal silicon layer, according to some embodiments of the present disclosure. Referring to FIG. 8, method 800 starts at operation 802, in which a dopant is implanted into the second substrate to form a heterogeneous interface in the second substrate.

Figure 4C:
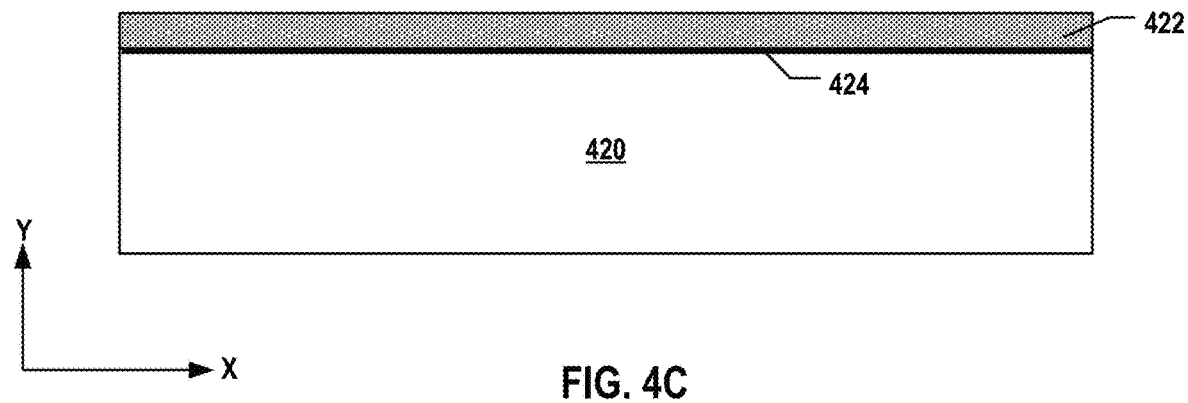

As illustrated in FIG. 4C, an ion implantation process is performed into a second silicon substrate 420 to form a heterogeneous interface 424 in second silicon substrate 420, which separates a doped first single-crystal silicon layer 422 from the remainder of second silicon substrate 420. In some embodiments, the dopant is hydrogen, including hydrogen ions and/or hydrogen atoms, most of which can be diffused out from first single-crystal silicon layer 422 during later thermal processes. It is understood that any other suitable dopants that can form heterogeneous interface 424 in second silicon substrate 420 may be used as well. For example, light-ion implantation may be used to implant light ions, such as protons or helium ions, into first single-crystal silicon layer 422, which can be later removed from first single-crystal silicon layer 422. The thickness of first single-crystal silicon layer 422, i.e., the distance between heterogeneous interface 424 and the front side of second silicon substrate 420 in the y-direction can be controlled by various parameters of the ion implantation, such as energy, dopant, dose, time, etc., as well as parameters of post-annealing, such as temperature and time of thermal diffusion following the ion implantation. In some embodiments, the thickness of first single-crystal silicon layer 422 is between about 1 μm and about 100 μm, such as between 1 μm and 100 μm (e.g., 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, any range bounded by the lower end by any of these values, or any range defined by any two of these values). Thickness uniformity can be controlled by fine-tuning control of the implanted dopants over the entire surface of second silicon substrate 420.

Heterogeneous interface 424 is an interface in second silicon substrate 420 between two layers with different materials, such as hydrogen-implanted single-crystal silicon and undoped single-crystal silicon as shown in FIG. 4C. The existence of heterogeneous interface 424 in second silicon substrate 420 can facilitate the separation of the two material layers, such as first single-crystal silicon layer 422 and the remainder of second silicon substrate 420, later in the de-bonding process. It is understood that heterogeneous interface 424 may be formed without ion implantation, for example, may be an existing interface between different material layers, such as in a SOI substrate.

Figure 4D:
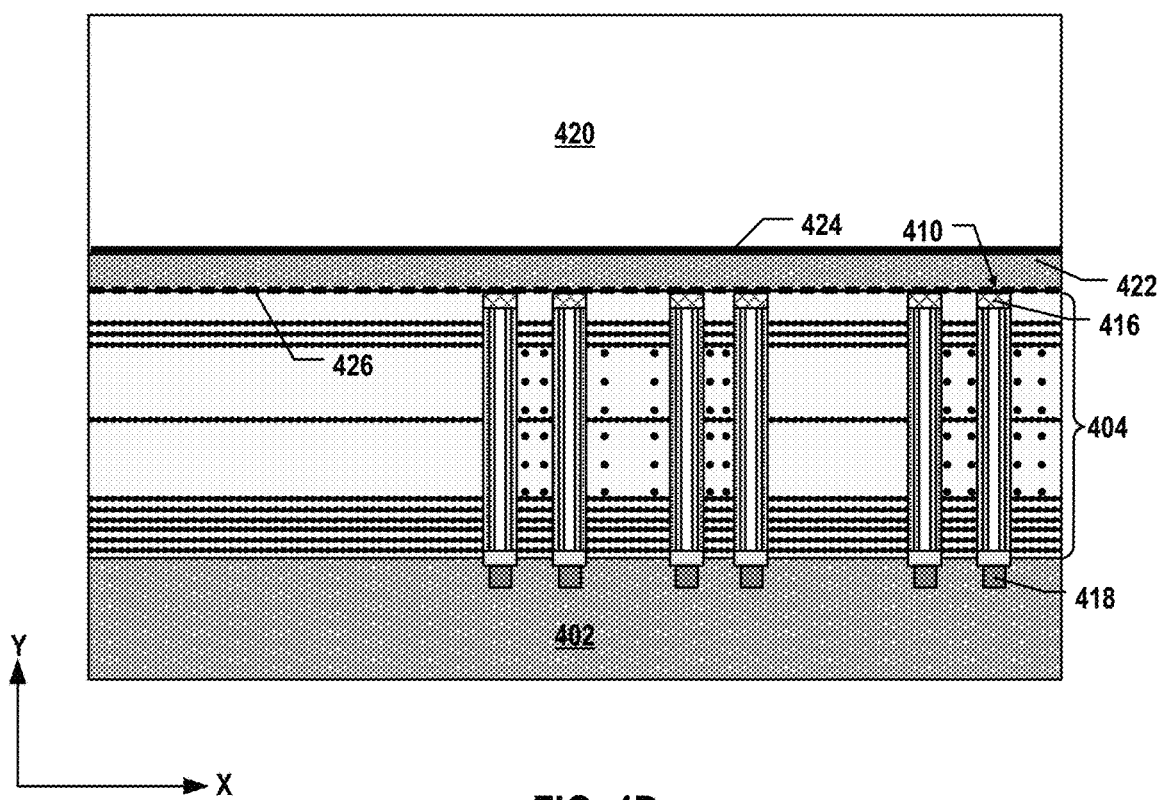

Method 800 proceeds to operation 804, as illustrated in FIG. 8, in which the second substrate and the first substrate are bonded in a face-to-face manner. In some embodiments, the bonding includes silicon-dielectric bonding, which has a relatively high bonding strength and yield. As illustrated in FIG. 4D, second silicon substrate 420 is flipped upside down, such that first single-crystal silicon layer 422 faces down toward the front side of first silicon substrate 402. First single-crystal silicon layer 422 of second silicon substrate 420 and first dielectric deck 404 of first silicon substrate 402 then can be bonded in a face-to-face manner to form silicon-oxygen bonds in a first bonding interface 426 between first single-crystal silicon layer 422 and first dielectric deck 404.

Figure 4E:
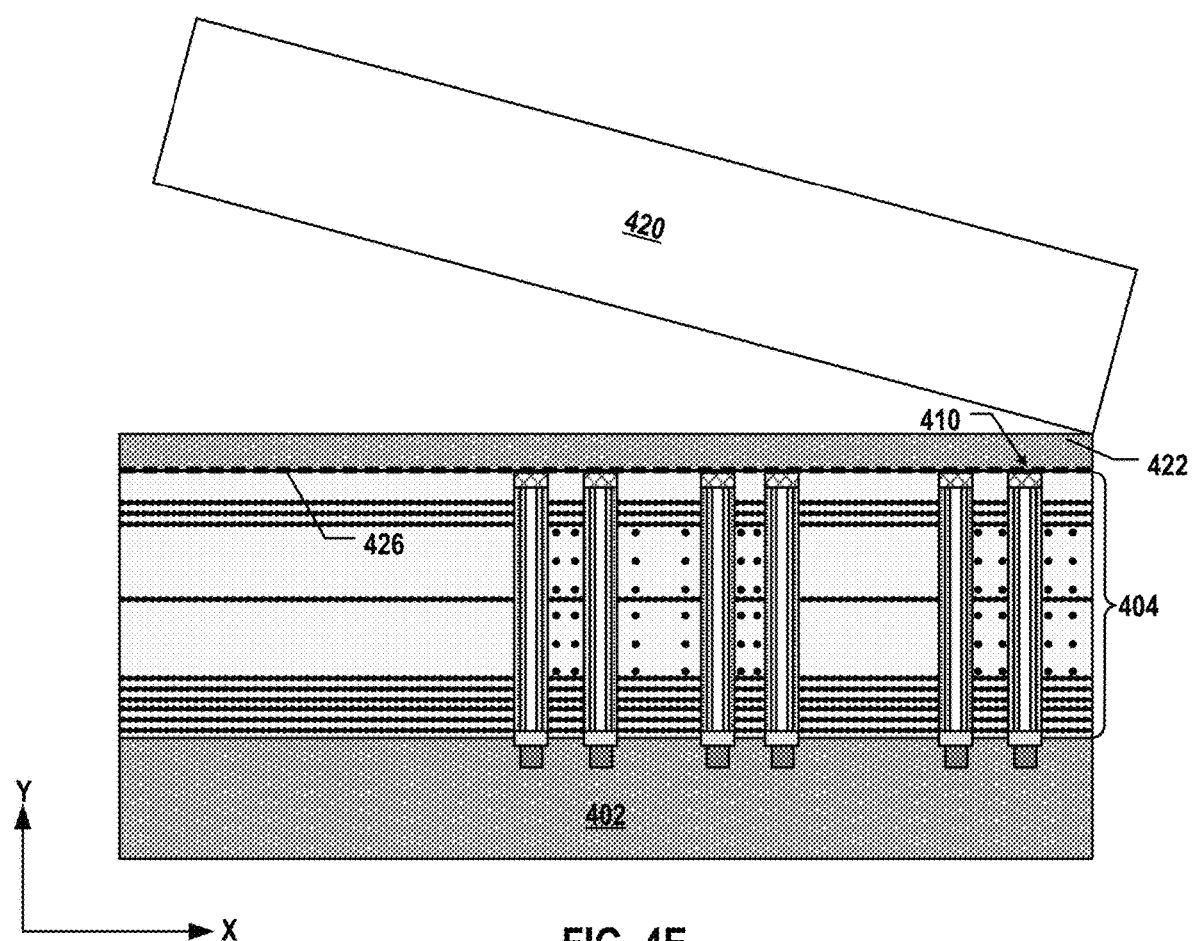

Method 800 proceeds to operation 806, as illustrated in FIG. 8, in which the single-crystal silicon layer is split from the second substrate along the heterogeneous interface in the second substrate to leave the single-crystal silicon layer. The single-crystal silicon layer remains bonded on the first dielectric deck, according to some embodiments. As illustrated in FIG. 4E, first single-crystal silicon layer 422 is split from second silicon substrate 420 along heterogeneous interface 424 by applying a mechanical force on second silicon substrate 420, for example, because the bonding strength at first bonding interface 426 is greater than the breaking force at heterogeneous interface 424. In other words, first single-crystal silicon layer 422 can be broken and peeled off from second silicon substrate 420 along heterogeneous interface 424. As a result, first single-crystal silicon layer 422 can be transferred from its donor substrate—second silicon substrate 420 to first silicon substrate 402 using the de-bonding process described above with respect to FIGS. 4C-4E and 8.

Referring back to FIG. 7, method 700 proceeds to operation 708 in which a first inter-deck plug is patterned in the first single-crystal silicon layer, such that the first inter-deck plug is above and in contact with the first channel structure. To pattern the first inter-deck plug, a dielectric surrounding the first inter-deck plug is deposited.

Figure 4F:
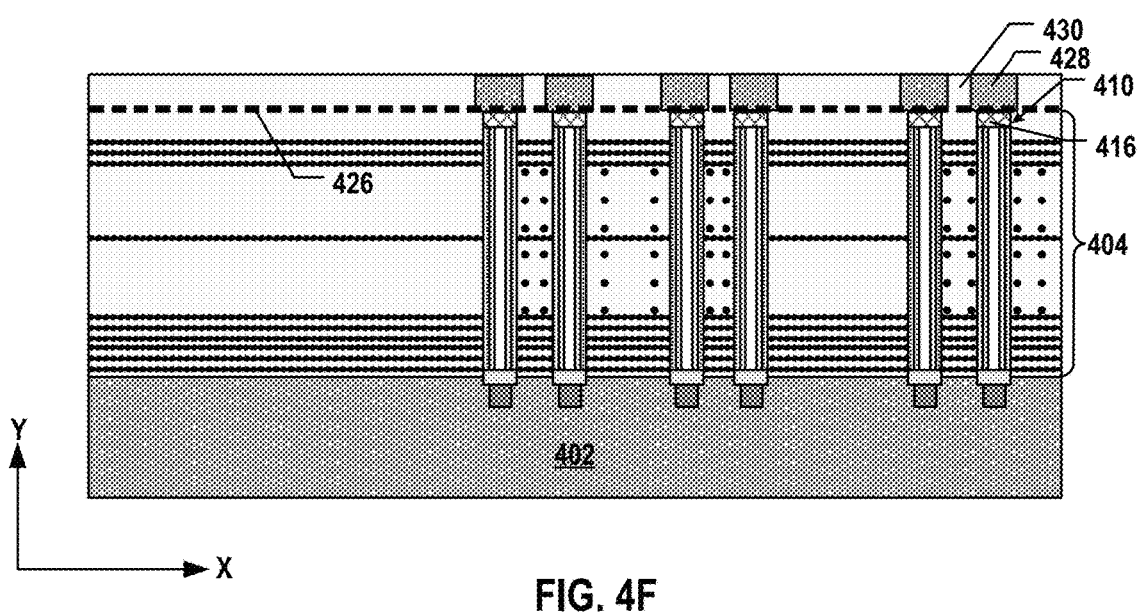

As illustrated in FIG. 4F, a plurality of first inter-deck plugs 428 are patterned in first single-crystal silicon layer 422 above first dielectric deck 404. Each first inter-deck plug 428 can be aligned with respective first channel structure 410 to be above and in contact with respective first channel structure 410. In some embodiments, first single-crystal silicon layer 422 is patterned using photolithography, development, and etching processes, leaving patterned first inter-deck plugs 428 aligned with underneath first channel structures 410. Dielectrics 430 then can be deposited to fill the openings between first inter-deck plugs 428 using one or more thin film deposition processes, such as CVD, PVD, ALD, electroplating, electroless plating, or any combination thereof, followed by a dielectric CMP process to planarize the top surface. As a result, first inter-deck plugs 428 can be formed above first dielectric deck 404, surrounding and electrically isolated by dielectrics 430 in the same layer. The thickness of first inter-deck plugs 428 and dielectrics 430 can be nominally the same as the thickness of first single-crystal silicon layer 422. In some embodiments in which first channel structure 410 includes upper plug 416, first inter-deck plug 428 is formed above and in contact with upper plug 416 of respective first channel structure (e.g., as shown in FIG. 4F). In some embodiments in which first channel structure 410 does not include upper plug 416, first inter-deck plug 428 is formed above and in contact with semiconductor channel 414 of respective first channel structure 410.

Figure 4G:
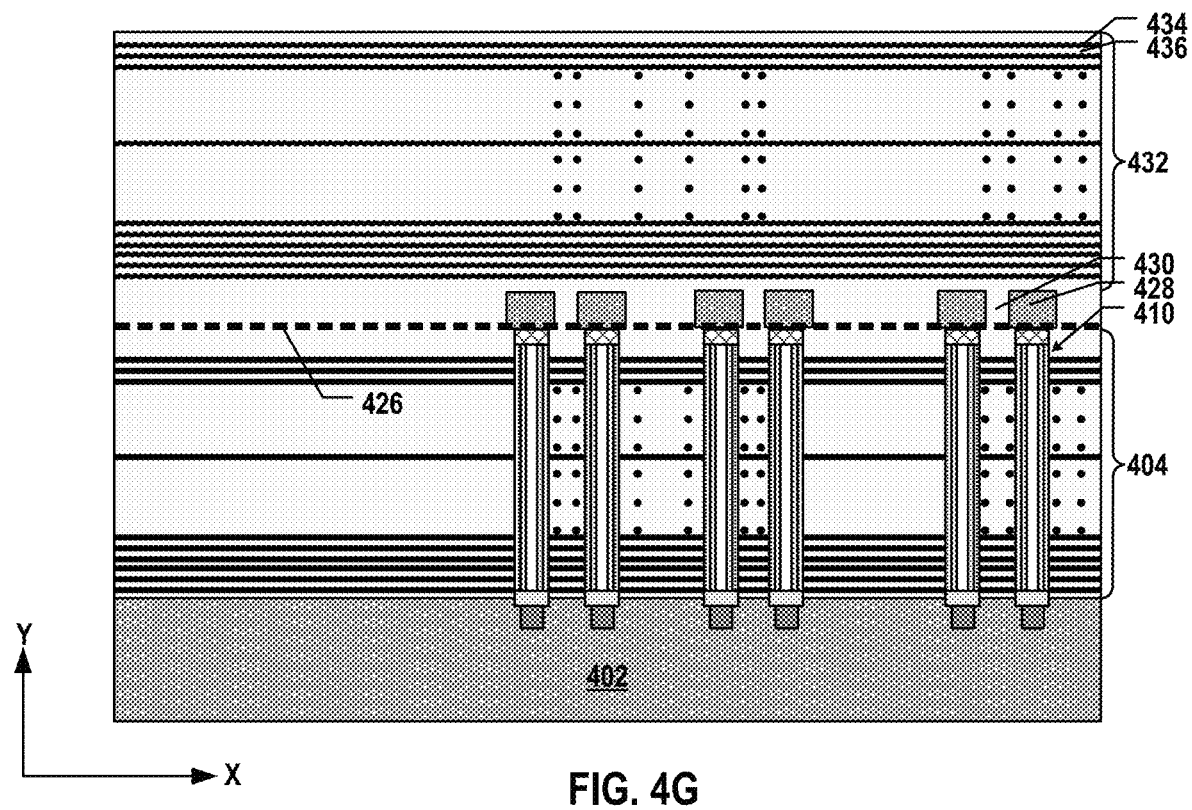

Method 700 proceeds to operation 710, as illustrated in FIG. 7, in which a second dielectric deck is formed above the first inter-deck plug. The second dielectric deck can include a second plurality of interleaved sacrificial layers and dielectric layers. As illustrated in FIG. 4G, a second dielectric deck 432 is formed above first inter-deck plugs 428. To form first dielectric deck 404, sacrificial layer 434 and dielectric layers 436 can be alternatively deposited above first inter-deck plugs 428 using one or more thin film deposition processes including, but not limited to, CVD, PVD, ALD, any other suitable processes, or any combination thereof. In some embodiments, each sacrificial layer 434 includes silicon nitride, and each dielectric layer 436 includes silicon oxide.

Method 700 proceeds to operation 712, as illustrated in FIG. 7, in which a second channel structure extending vertically through the second dielectric deck is formed, such that the second channel structure is above and in contact with the first inter-deck plug. To form the second channel structure, a second channel hole is etched through the second dielectric deck, and a second memory film and a second semiconductor channel are subsequently deposited along a sidewall of the second channel hole, according to some embodiments. In some embodiments, an upper plug including polysilicon is further formed at an upper end of the second channel hole.

Figure 4H:
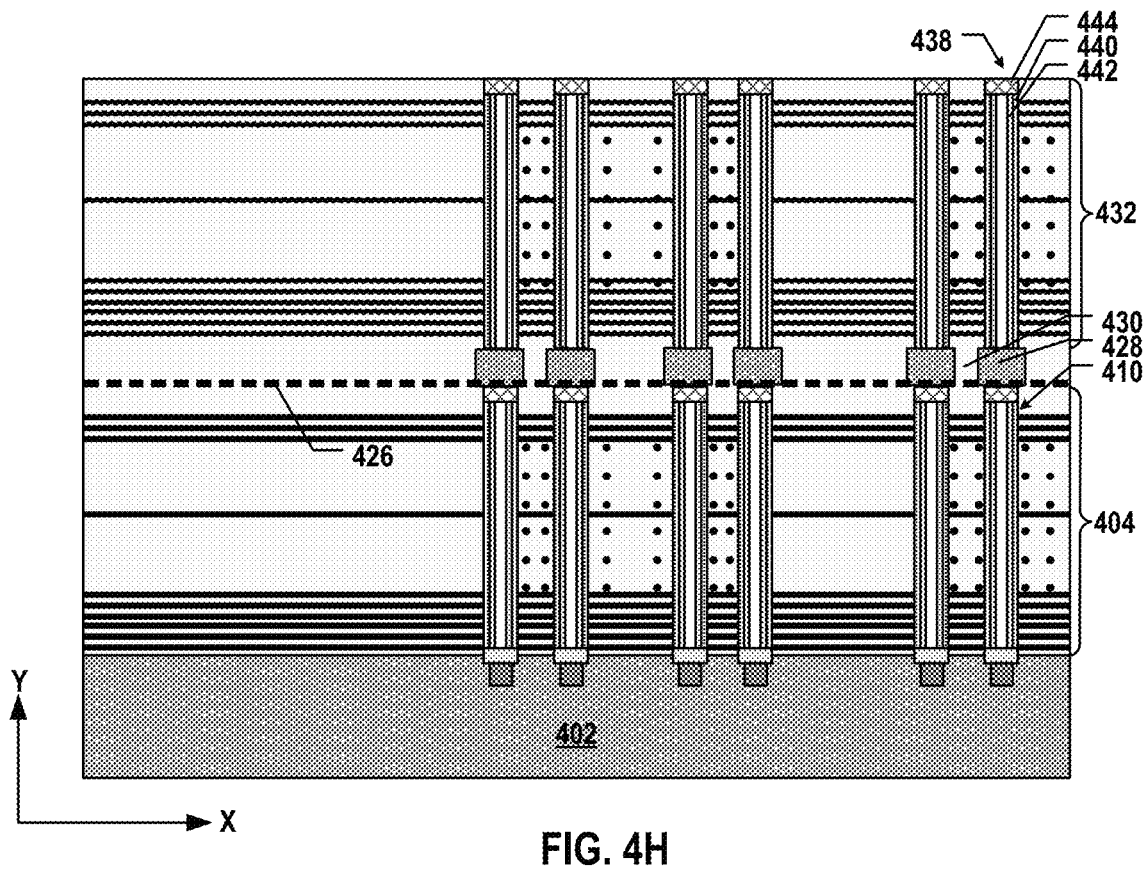

As illustrated in FIG. 4H, second channel structures 438 each extending vertically through second dielectric deck 432 are formed above first inter-deck plugs 428. For each second channel structure 438, a second channel hole (not shown) is first etched through second dielectric deck 432 using one or more dry etch processes and/or wet etch processes, such as DRIE, according to some embodiments. Each second channel hole is patterned to be aligned with respective first inter-deck plug 428, such that resulting second channel structure 438 is electrically connected to respective first inter-deck plug 428 and first channel structure 410. A memory film 440 and a semiconductor channel 442 then can be subsequently deposited along the sidewall of the second channel hole using one or more thin film deposition processes, such as ALD, CVD, PVD, any other suitable processes, or any combination thereof. As a result, semiconductor channel 442 of second channel structure 438 can be formed above and in contact with first inter-deck plug 428.

As illustrated in FIG. 4H, after forming memory film 440 and semiconductor channel 442, an upper plug 444 is formed at the upper end of the second channel structure. In some embodiments, parts of memory film 440 and semiconductor channel 442 at the upper end of the second channel hole can be removed by CMP, grinding, wet etching, and/or dry etching to form a recess at the upper end of the second channel hole. Upper plug 444 then can be formed by depositing semiconductor materials, such as polysilicon, into the recess by one or more thin film deposition processes, such as CVD, PVD, ALD, electroplating, electroless plating, or any combination thereof. Second channel structure 438 is thereby formed.

Method 700 proceeds to operation 714, as illustrated in FIG. 7, in which a first memory deck and a second memory deck each including interleaved conductor layers and the dielectric layers are formed by gate replacement, i.e., replacing the sacrificial layers in the first dielectric deck and the second dielectric deck with the conductor layers. To form the first and second memory decks, a slit opening extending vertically through the first and second dielectric decks is etched, the sacrificial layers in the first dielectric deck and the second dielectric deck are replaced with the conductor layers through the slit opening, and a spacer and a conductor layer are subsequently deposited into the slit opening. It is understood that the fabrication process for forming a multi-deck 3D memory device is vertically-scalable. Thus, more dielectric decks, channel structures, and inter-deck plugs may be formed using substantially similar processes described above prior to the gate-replacement process for forming the memory decks.

Figure 4I:
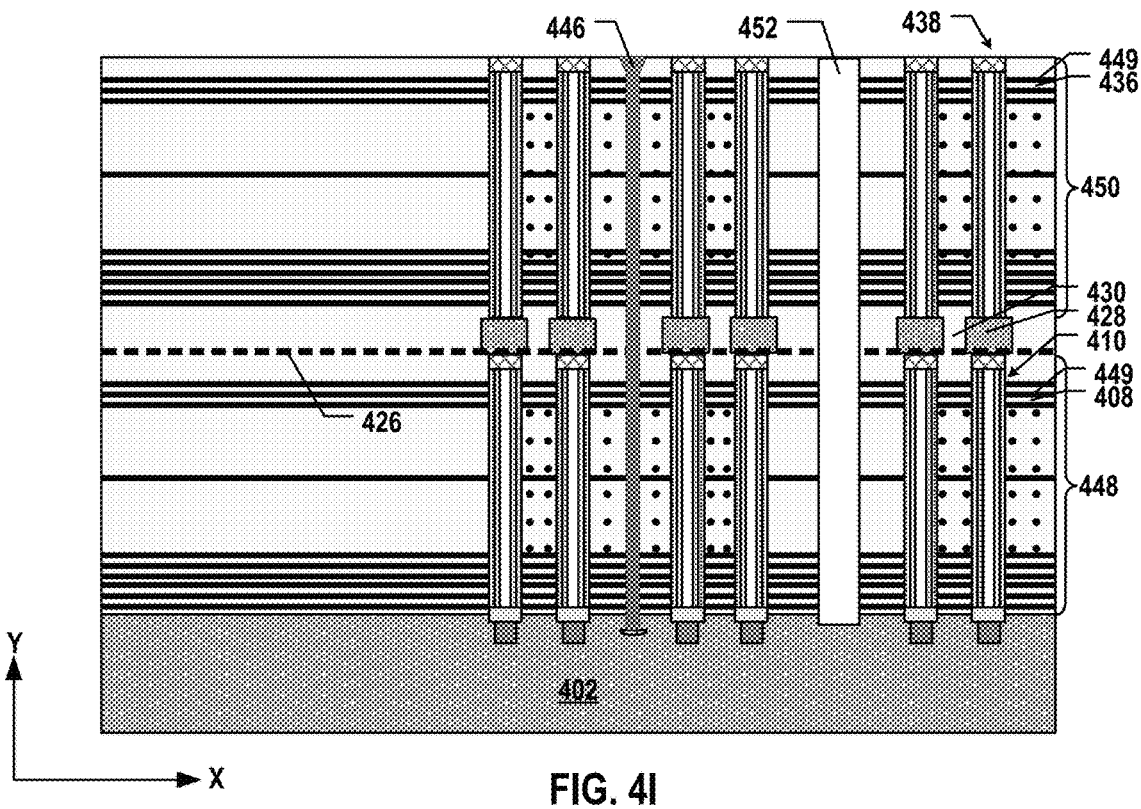

As illustrated in FIG. 4I, a slit opening (not shown) is formed extending vertically through both first and second dielectric decks 404 and 432 as well as dielectrics 430 surrounding first inter-deck plug 428 (as shown in FIG. 4H). The slit opening can be patterned and etched by wet etch and/or dry etch process, such as DRIE. Each sacrificial layer 406 (as shown in FIG. 4A) of first dielectric deck 404 and each sacrificial layer 434 (as shown in FIG. 4G) of second dielectric deck 432 then can be etched through the slit opening, and conductor layers 449 can be deposited to fill the recesses left by sacrificial layers 406 and 434 through the slit opening. That is, each sacrificial layer 406 of first dielectric deck 404 and each sacrificial layer 434 of second dielectric deck 432 can be replaced by conductor layer 449, thereby forming a first memory deck 448 including interleaved conductor layers 449 and dielectric layers 408 and a second memory deck 450 including interleaved conductor layers 449 and dielectric layers 436, respectively. The replacement of sacrificial layers 406 and 434 with conductor layers 449 can be performed by wet etch and/or dry etch of sacrificial layers 406 and 434 selective to dielectric layers 408 and 436 and filling the remaining recesses with conductor layers 449 using one or more thin film deposition processes, such as CVD, PVD, ALD, or any combination thereof.

As illustrated in FIG. 4I, after the gate-replacement process, a spacer (e.g., including one or more dielectric layers, such as silicon oxide layer or silicon nitride layer, not shown) and a conductor layer (such as a tungsten layer) are subsequently deposited into the slit opening using one or more thin film deposition processes, such as CVD, PVD, ALD, or any combination thereof, to form a slit structure 446, which extends vertically through first and second memory decks 448 and 450 and into first silicon substrate 402. In some embodiments, a doped region is formed by ion implantation and/or thermal diffusion in first silicon substrate 402 through the slit opening prior to depositing the spacer and conductor layer into the slit opening.

Figure 4J:
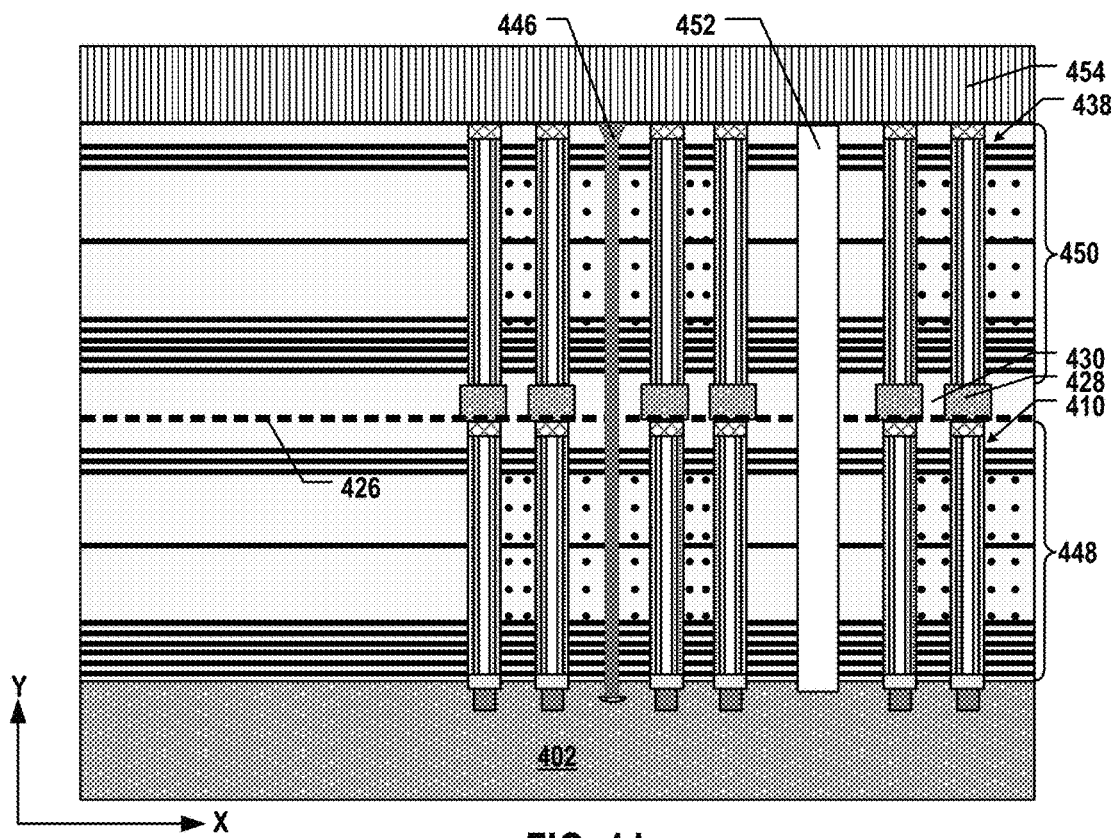

Method 700 proceeds to operation 716, as illustrated in FIG. 7, in which an interconnect layer is formed above the second memory deck. In some embodiments, a TAC extending vertically through the first memory deck and the second memory deck is formed and electrically connected to the interconnect layer. As illustrated in FIG. 4I, a TAC 452 extending vertically through first and second memory decks 448 and 450 to first silicon substrate 402 is formed by wet etch and/or dry etch process, such as DRIE, followed by one or more thin film deposition processes, such as CVD, PVD, ALD, or any combination thereof. As illustrated in FIG. 4J, an array interconnect layer 454 is formed above second memory deck 450 and electrically connected to TAC 452. Array interconnect layer 454 can include interconnects, such as bit lines, formed in one or more ILD layers and electrically connected to first and second channel structures 410 and 438 as well as slit structure 446. In some embodiments, array interconnect layer 454 is formed monolithically on second memory deck 450 using one or more thin film deposition processes, such as CVD, PVD, ALD, electroplating, electroless plating, or any combination thereof. The interconnects in array interconnect layer 454 can be patterned using photolithography, dry etch and/or wet etch, and CMP processes. In some embodiments, array interconnect layer 454 is formed non-monolithically on a donor substrate and then transferred onto second memory deck 450 above first silicon substrate 402 using a de-bonding process described herein, for example, as described above with respect to FIG. 8.

Figure 9:
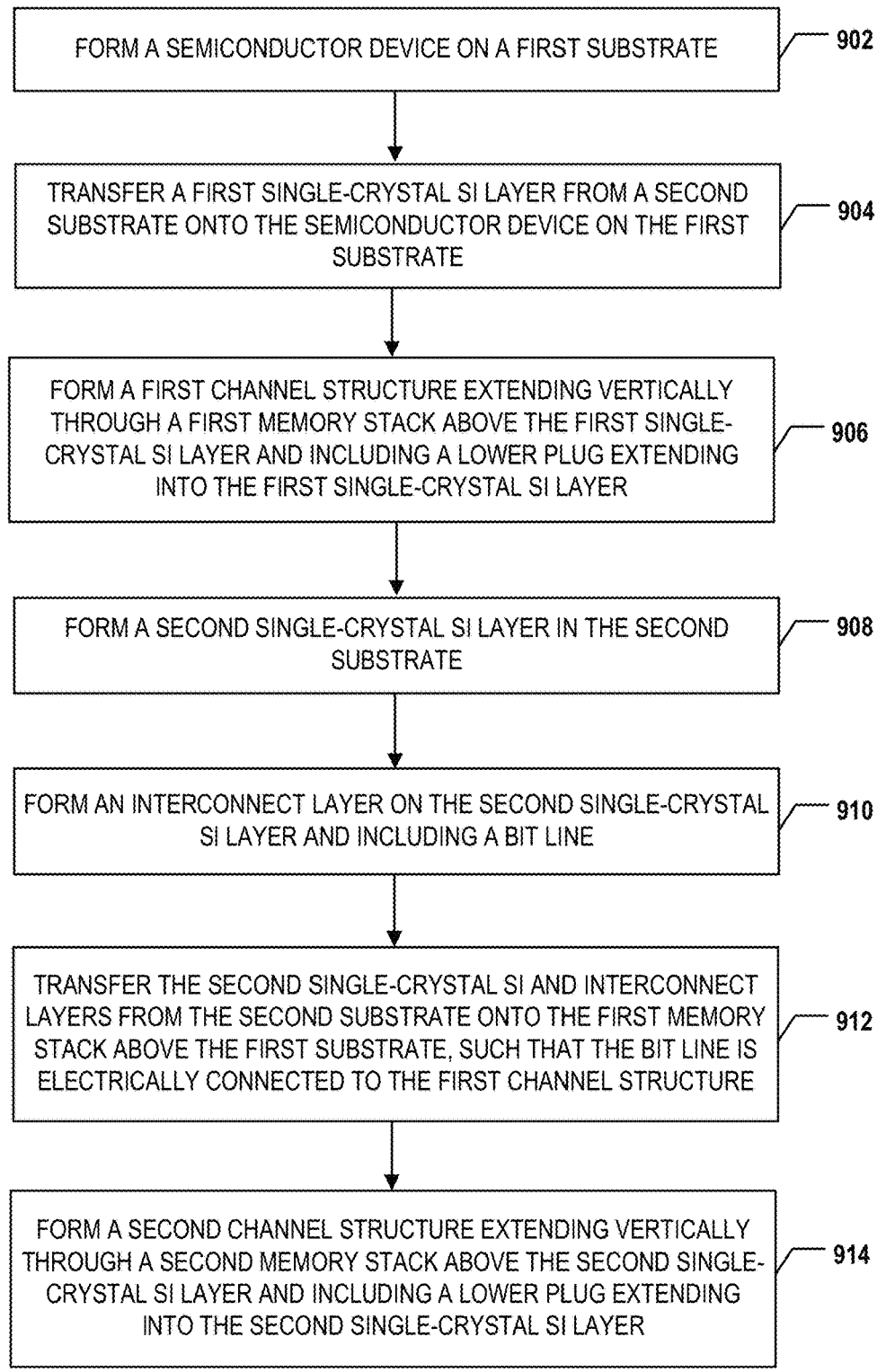
FIG. 9 is a flowchart of an exemplary method for forming a multi-stack 3D memory device having transferred interconnect layers, according to some embodiments of the present disclosure.

FIGS. 5A-5J illustrate an exemplary fabrication process for forming a multi-stack 3D memory device having transferred interconnect layers, according to some embodiments of the present disclosure. FIG. 9 is a flowchart of an exemplary method 900 for forming a multi-stack 3D memory device having transferred interconnect layers, according to some embodiments of the present disclosure. Examples of the 3D memory device depicted in FIGS. 5A-5J and 9 include 3D memory device 200 depicted in FIG. 2. FIGS. 5A-5J and 9 will be described together. It is understood that the operations shown in method 900 are not exhaustive and that other operations can be performed as well before, after, or between any of the illustrated operations. Further, some of the operations may be performed simultaneously, or in a different order than shown in FIG. 9.

Referring to FIG. 9, method 900 starts at operation 902, in which a semiconductor device is formed on a first substrate. In some embodiments, the semiconductor device includes a peripheral device layer. In some embodiments, the semiconductor device includes a channel structure extending vertically through a memory stack. An interconnect layer is formed above the semiconductor device on the first substrate, according to some embodiments. The substrate can be a silicon substrate.

Figure 5A:
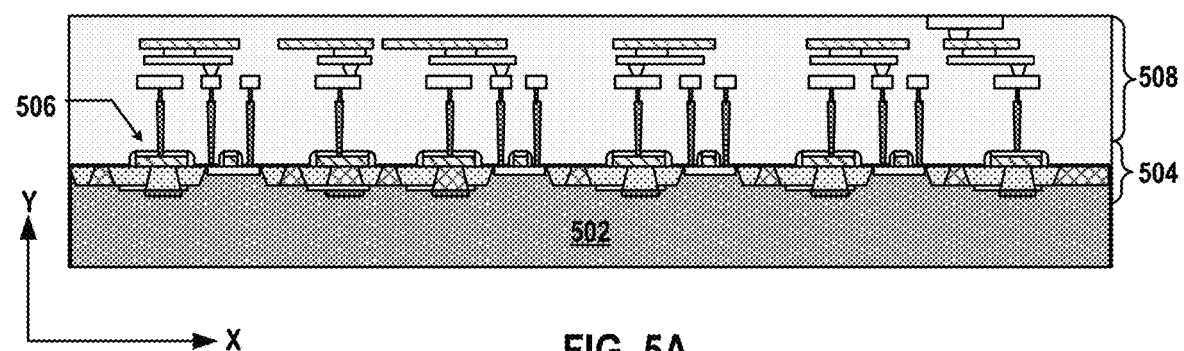
FIGS. 5A-5J illustrate an exemplary fabrication process for forming a multi-stack 3D memory device having transferred interconnect layers, according to some embodiments of the present disclosure.

As illustrated in FIG. 5A, a peripheral device layer 504 is formed on a first silicon substrate 502. Peripheral device layer 504 can include a plurality of transistors 506 formed on first silicon substrate 502. Transistors 506 can be formed by a plurality of processes including, but not limited to, photolithography, dry and/or wet etching, thin film deposition, thermal growth, implantation, CMP, and any other suitable processes. In some embodiments, doped regions are formed in first silicon substrate 502 by ion implantation and/or thermal diffusion, which function, for example, as source regions and/or drain regions of transistors 506. In some embodiments, isolation regions (e.g., STIs) are also formed in first silicon substrate 502 by dry and/or wet etching and thin film deposition. Transistors 506 in peripheral device layer 504 can form a variety types of circuits, such as a multiplexer, a data buffer, and a driver.

As illustrated in FIG. 5A, a peripheral interconnect layer 508 is formed above peripheral device layer 504 on first silicon substrate 502. Peripheral interconnect layer 508 can include one or more ILD layers and interconnects therein formed using multiple processes. For example, the interconnects can include conductive materials deposited by one or more thin film deposition processes including, but not limited to, CVD, PVD, ALD, electroplating, electroless plating, or any combination thereof. The ILD layers can include dielectric materials deposited by one or more thin film deposition processes including, but not limited to, CVD, PVD, ALD, or any combination thereof.

Method 900 proceeds to operation 904, as illustrated in FIG. 9, in which a first single-crystal silicon layer is transferred from a second substrate (a "donor substrate") onto the first semiconductor device on the first substrate. In some embodiments, to transfer the first single-crystal silicon layer, a heterogeneous interface is formed in the second substrate, for example, by implanting a dopant, such as hydrogen, into the second substrate. In some embodiments, to transfer the first single-crystal silicon layer, the second substrate and the first substrate are bonded in a face-to-face manner. In some embodiments, to transfer the first single-crystal silicon layer, the first single-crystal silicon layer is split from the second substrate along the heterogeneous interface in the second substrate to leave the first single-crystal silicon layer.

Figure 5B:
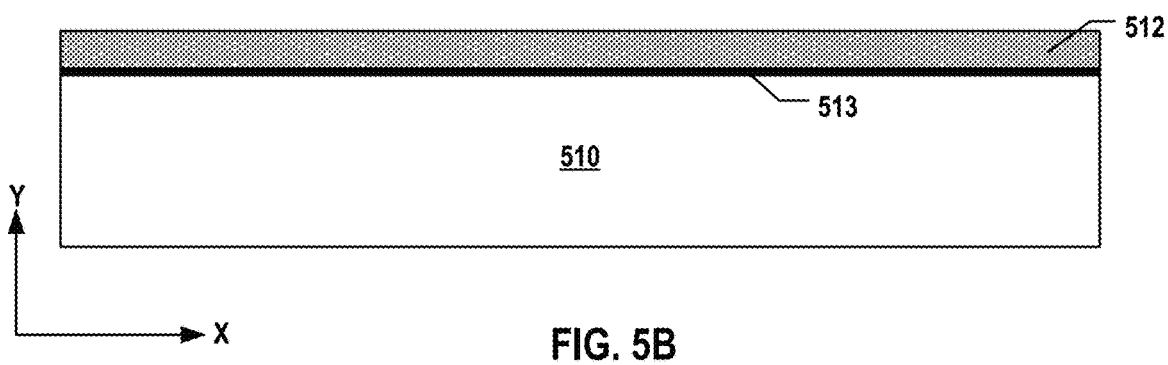

As illustrated in FIG. 5B, an ion implantation process is performed into a second silicon substrate 510 to form a heterogeneous interface 513 in second silicon substrate 510, which separates a doped first single-crystal silicon layer 512 from the remainder of second silicon substrate 510. In some embodiments, the dopant is hydrogen, including hydrogen ions and/or hydrogen atoms, most of which can be diffused out from first single-crystal silicon layer 512 during later thermal processes. It is understood that any other suitable dopants that can form heterogeneous interface 513 in second silicon substrate 510 may be used as well. For example, light-ion implantation may be used to implant light ions, such as protons or helium ions, into first single-crystal silicon layer 512 which can be later removed from first single-crystal silicon layer 512. The thickness of first single-crystal silicon layer 512, i.e., the distance between heterogeneous interface 513 and the front side of second silicon substrate 510 in the y-direction can be controlled by various parameters of the ion implantation, such as energy, dopant, dose, time, etc., as well as parameters of post-annealing, such as temperature and time of thermal diffusion following the ion implantation. In some embodiments, the thickness of first single-crystal silicon layer 512 is between about 1 μm and about 100 μm, such as between 1 μm and 100 μm (e.g., 1 μm, 2 μm, 3 μm, 4 μm, 5 μm, 6 μm, 7 μm, 8 μm, 9 μm, 10 μm, 15 μm, 20 μm, 25 μm, 30 μm, 35 μm, 40 μm, 45 μm, 50 μm, 55 μm, 60 μm, 65 μm, 70 μm, 75 μm, 80 μm, 85 μm, 90 μm, 95 μm, 100 μm, any range bounded by the lower end by any of these values, or any range defined by any two of these values). Thickness uniformity can be controlled by fine-tuning control of the implanted dopants over the entire surface of second silicon substrate 510.

Figure 5C:
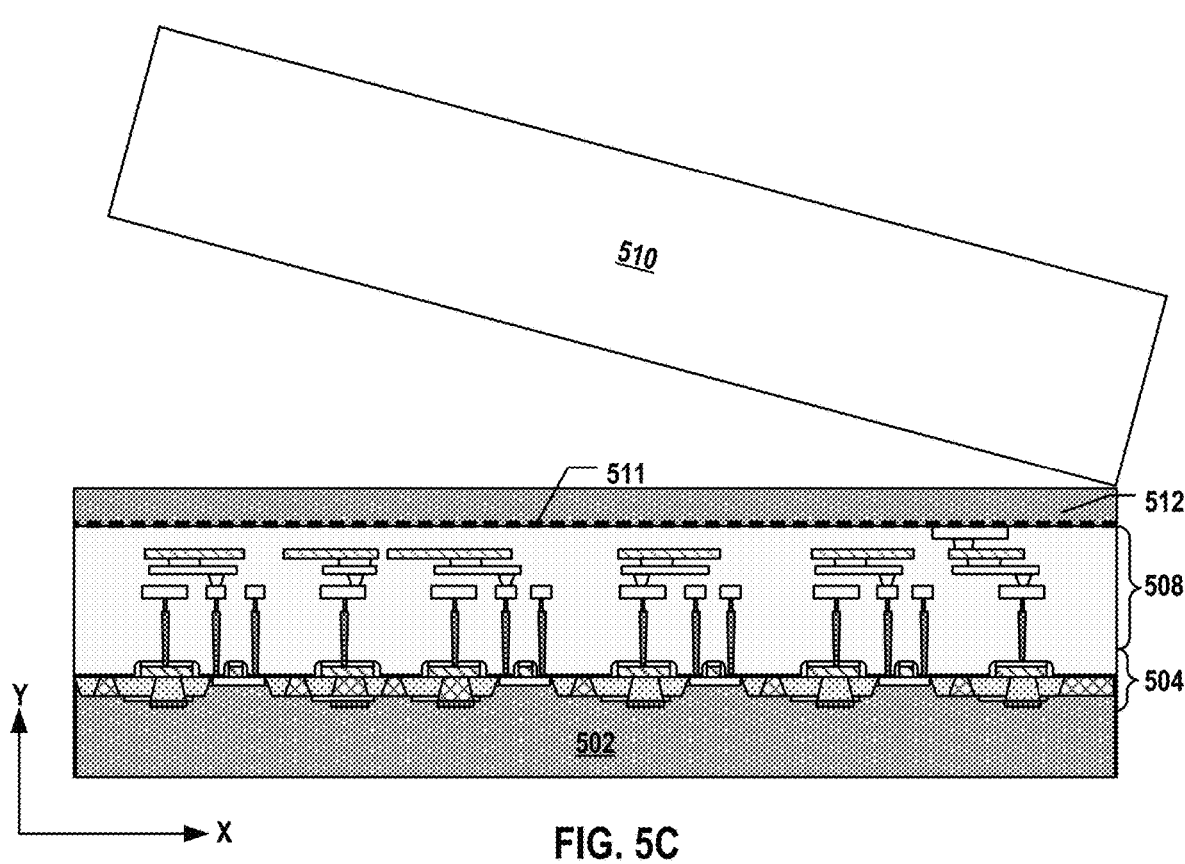

Second silicon substrate 510 can be flipped upside down, such that first single-crystal silicon layer 512 faces down toward the front side of first silicon substrate 502. First single-crystal silicon layer 512 of second silicon substrate 510 and peripheral interconnect layer 508 of first silicon substrate 502 then can be bonded in a face-to-face manner to form silicon-oxygen bonds in a first bonding interface 511 between first single-crystal silicon layer 512 and peripheral interconnect layer 508. As illustrated in FIG. 5C, first single-crystal silicon layer 512 is split from second silicon substrate 510 along heterogeneous interface 513 by applying a mechanical force on second silicon substrate 510, for example, because the bonding strength at first bonding interface 511 is greater than the breaking force at heterogeneous interface 513. In other words, first single-crystal silicon layer 512 can be broken and peeled off from second silicon substrate 510 along heterogeneous interface 513. As a result, first single-crystal silicon layer 512 can be transferred from its donor substrate—second silicon substrate 510 to first silicon substrate 502 using the de-bonding process.

Method 900 proceeds to operation 906, as illustrated in FIG. 9, in which a first channel structure extending vertically through a first memory stack above the first single-crystal silicon layer is formed. The first memory stack can include interleaved conductor layers and dielectric layers. The first channel structure includes a lower plug extending into the first single-crystal silicon layer and including single-crystal silicon, according to some embodiments. In some embodiments, to form the first memory stack, a first dielectric stack including interleaved sacrificial layers and dielectric layers is formed on the first single-crystal silicon layer, and the first memory stack is formed by replacing the sacrificial layers in the dielectric stack with the conductor layers. For example, a slit opening extending vertically through the first dielectric stack may be etched, the sacrificial layers in the first dielectric stack may be replaced with the conductor layers through the slit opening, and a spacer and a conductor layer may be subsequently deposited into the slit opening. In some embodiments, to form the first channel structure, a first channel hole is etched through the first dielectric stack and into the first single-crystal silicon layer, the lower plug is epitaxially grown into a bottom portion of the first channel hole from the first single-crystal silicon layer, and a memory film and a semiconductor channel are subsequently deposited along a sidewall of the first channel hole and above the lower plug.

Figure 5D:
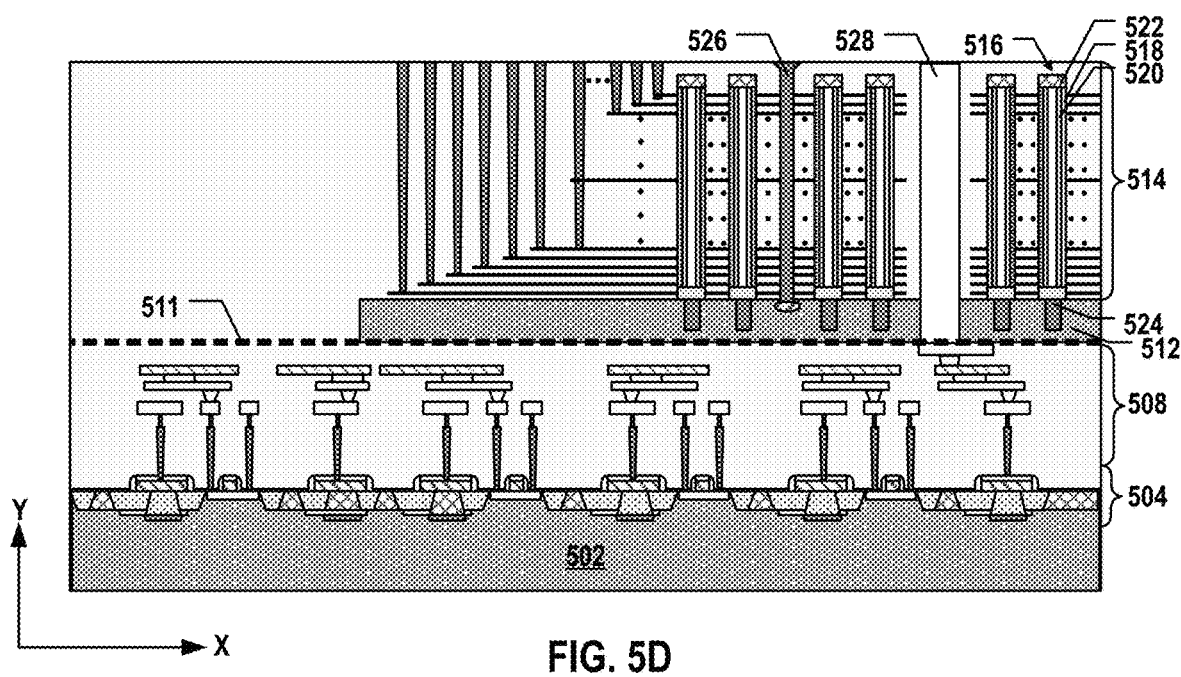

As illustrated in FIG. 5D, a first memory stack 514 including interleaved conductor layers and dielectric layers is formed on first single-crystal silicon layer 512. In some embodiments, a dielectric stack (not shown) including interleaved sacrificial layers and dielectric layers is first formed on first single-crystal silicon layer 512 by alternatingly depositing two different dielectric layers (e.g., silicon nitride and silicon oxide) using one or more thin film deposition processes including, but not limited to, CVD, PVD, ALD, or any combination thereof. Channel holes (not shown) then can be etched through the dielectric stack and into first single-crystal silicon layer 512 using wet etch and/or dry etch processes, such as DRIE. In some embodiments, lower plugs 524, e.g., SEG plugs, are epitaxially grown into the bottom portion of each channel hole from first single-crystal silicon layer 512 using, for example, VPE, LPE, MBE, or any combinations thereof. Lower plugs 524 thus can include the same material as first single-crystal silicon layer 512, i.e., single-crystal silicon.

After forming lower plug 524, a memory film 518 and a semiconductor channel 520 can be subsequently deposited along the sidewall of each channel hole above lower plug 524. In some embodiments, a blocking layer, a storage layer, and a tunneling layer are subsequently deposited in this order using one or more thin film deposition processes, such as ALD, CVD, PVD, any other suitable processes, or any combination thereof, to form memory film 518. Semiconductor channel 520 can then be deposited on the tunneling layer using one or more thin film deposition processes, such as ALD, CVD, PVD, any other suitable processes, or any combination thereof. After forming memory film 518 and semiconductor channel 520, an upper plug 522 can be formed at the upper end of each channel hole. In some embodiments, parts of memory film 518 and semiconductor channel 520 at the upper end of the channel hole are removed by to form a recess. Upper plug 522 then can be formed by depositing semiconductor materials, such as polysilicon, into the recess by one or more thin film deposition processes, such as CVD, PVD, ALD, electroplating, electroless plating, or any combination thereof. First channel structure 516 is thereby formed.

As illustrated in FIG. 5D, a slit opening (not shown) is formed extending vertically through the dielectric stack. The slit opening can be patterned and etched by wet etch and/or dry etch process, such as DRIE. Each sacrificial layer of the dielectric stack then can be etched through the slit opening, and the conductor layers can be deposited to fill the recesses left by the sacrificial layers through the slit opening. That is, each sacrificial layer of the dielectric stack can be replaced by a conductor layer, thereby forming first memory stack 514. The replacement of the sacrificial layers with the conductor layers can be performed by wet etch and/or dry etch of the sacrificial layers selective to the dielectric layers and filling the remaining recesses with the conductor layers using one or more thin film deposition processes, such as CVD, PVD, ALD, or any combination thereof. In some embodiments, after the gate-replacement process, a spacer (e.g., including one or more dielectric layers, such as silicon oxide layer or silicon nitride layer, not shown) and a conductor layer (such as a tungsten layer) are subsequently deposited into the slit opening using one or more thin film deposition processes, such as CVD, PVD, ALD, or any combination thereof, to form a slit structure 526, which extends vertically through first memory stack 514 and into first single-crystal silicon layer 512.

As illustrated in FIG. 5D, in some embodiments, a TAC 528 extending vertically through first memory stack 514 and first single-crystal silicon layer 512 is formed by wet etch and/or dry etch process, such as DRIE, followed by one or more thin film deposition processes, such as CVD, PVD, ALD, or any combination thereof, according to some embodiments. As a result, TAC 528 can be in contact with the interconnects in peripheral interconnect layer 508.

Figure 5E:
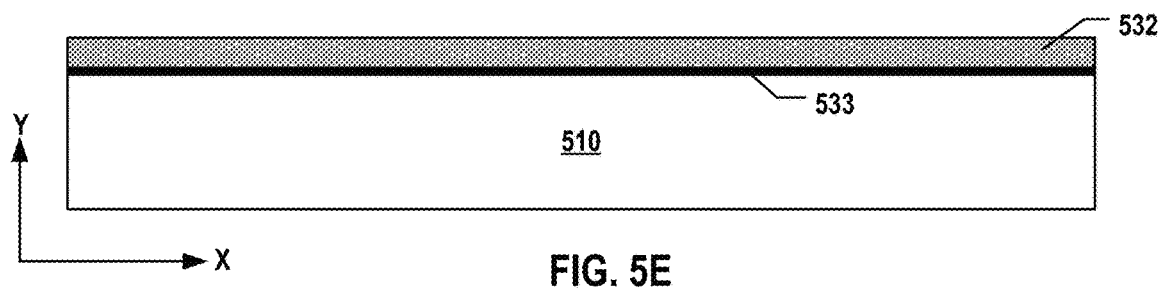

Method 900 proceeds to operation 908, as illustrated in FIG. 9, in which a second single-crystal silicon layer is formed in the second substrate. The second substrate is the same donor substrate from which the first single-crystal silicon layer is transferred, according to some embodiments. It is understood that a different donor substrate may be used for forming the second single-crystal silicon layer in other embodiments. In some embodiments, to form the second single-crystal silicon layer, a heterogeneous interface is formed in the second substrate, for example, by implanting a dopant into the second substrate. As illustrated in FIG. 5E, an ion implantation process is performed again into second silicon substrate 510 to form a heterogeneous interface 533 in second silicon substrate 510, which separates a doped second single-crystal silicon layer 532 from the remainder of second silicon substrate 510. The fabrication processes for forming second single-crystal silicon layer 532 is substantially similar to those for forming first single-crystal silicon layer 512 as described above with respect to FIG. 5B and thus, are not repeated.

Figure 5F:
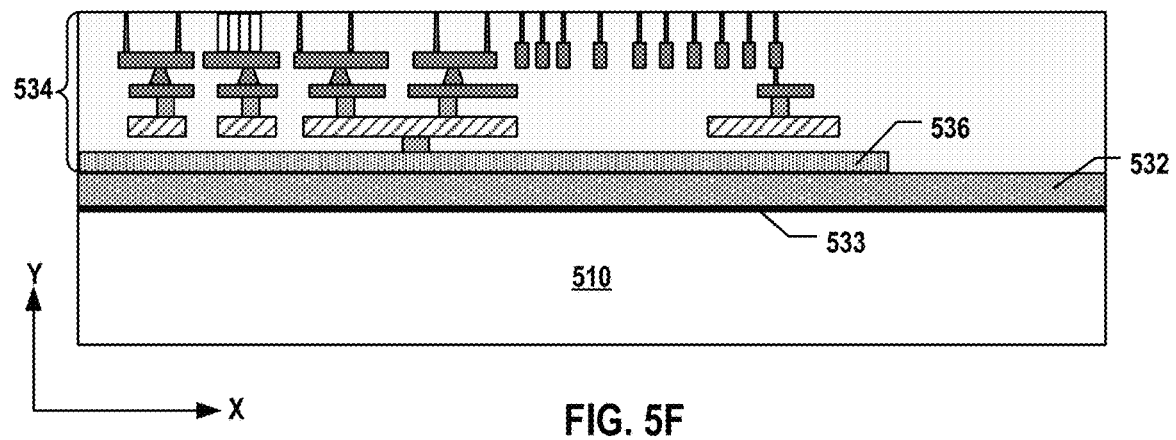

Method 900 proceeds to operation 910, as illustrated in FIG. 9, in which an interconnect layer is formed on the second single-crystal silicon layer. The interconnect layer can include a bit line. As illustrated in FIG. 5F, an array interconnect layer 534 is formed on second single-crystal silicon layer 532. Array interconnect layer 534 can include one or more ILD layers and interconnects therein, including a bit line 536, formed using multiple processes. For example, the interconnects can include conductive materials deposited by one or more thin film deposition processes including, but not limited to, CVD, PVD, ALD, electroplating, electroless plating, or any combination thereof. The ILD layers can include dielectric materials deposited by one or more thin film deposition processes including, but not limited to, CVD, PVD, ALD, or any combination thereof. In some embodiments, bit line 536 is formed directly on second single-crystal silicon layer 532 without any passivation layer (e.g., an ILD layer including dielectrics such as silicon oxide) in-between, as shown in FIG. 5F. In some embodiments, a passivation layer (not shown) is formed on second single-crystal silicon layer 532, and bit line 536 is formed on the passivation layer.

Method 900 proceeds to operation 912, as illustrated in FIG. 9, in which the second single-crystal silicon layer and the interconnect layer formed thereon are transferred from the second substrate onto the first memory stack above the first substrate, such that the bit line is electrically connected to the first channel structure, and the second single-crystal silicon layer becomes above the interconnect layer. In some embodiments, to transfer the second single-crystal silicon layer and the interconnect layer formed thereon, the second single-crystal silicon layer and the interconnect layer formed thereon are split from the second substrate along the heterogeneous interface in the second substrate, and the second single-crystal silicon layer and the interconnect layer formed thereon and the first substrate are bonded in a face-to-face manner. The bonding can include hybrid bonding.

Figure 5G:
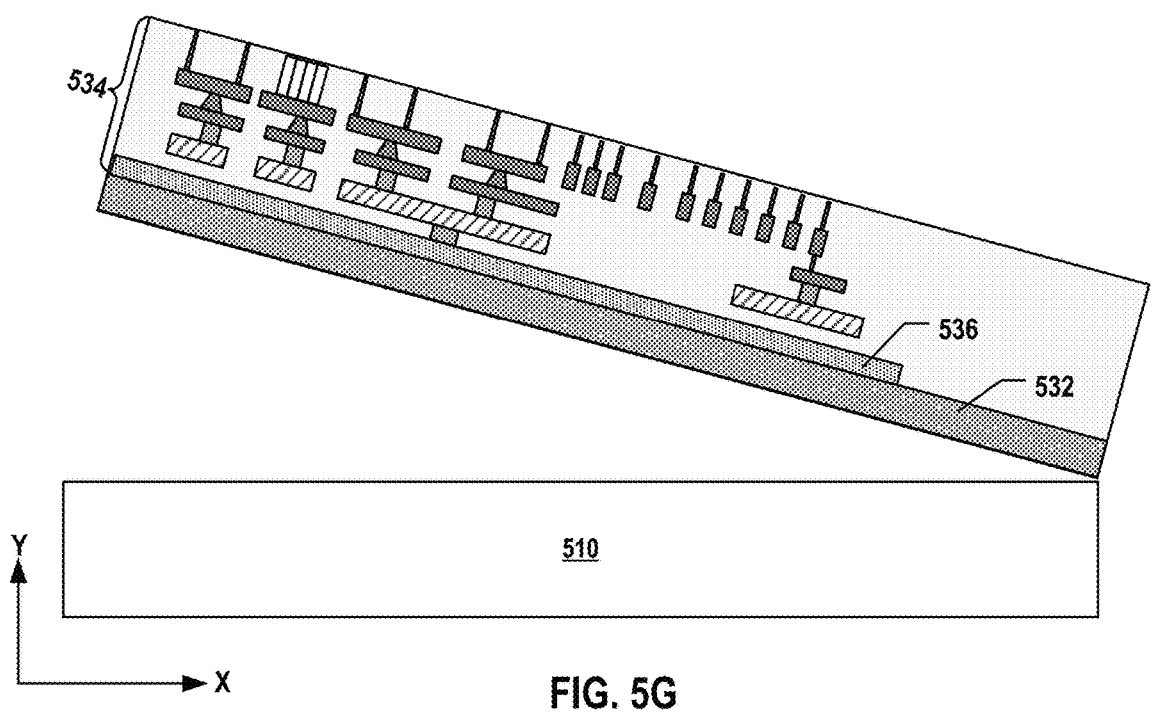
Figure 5H:
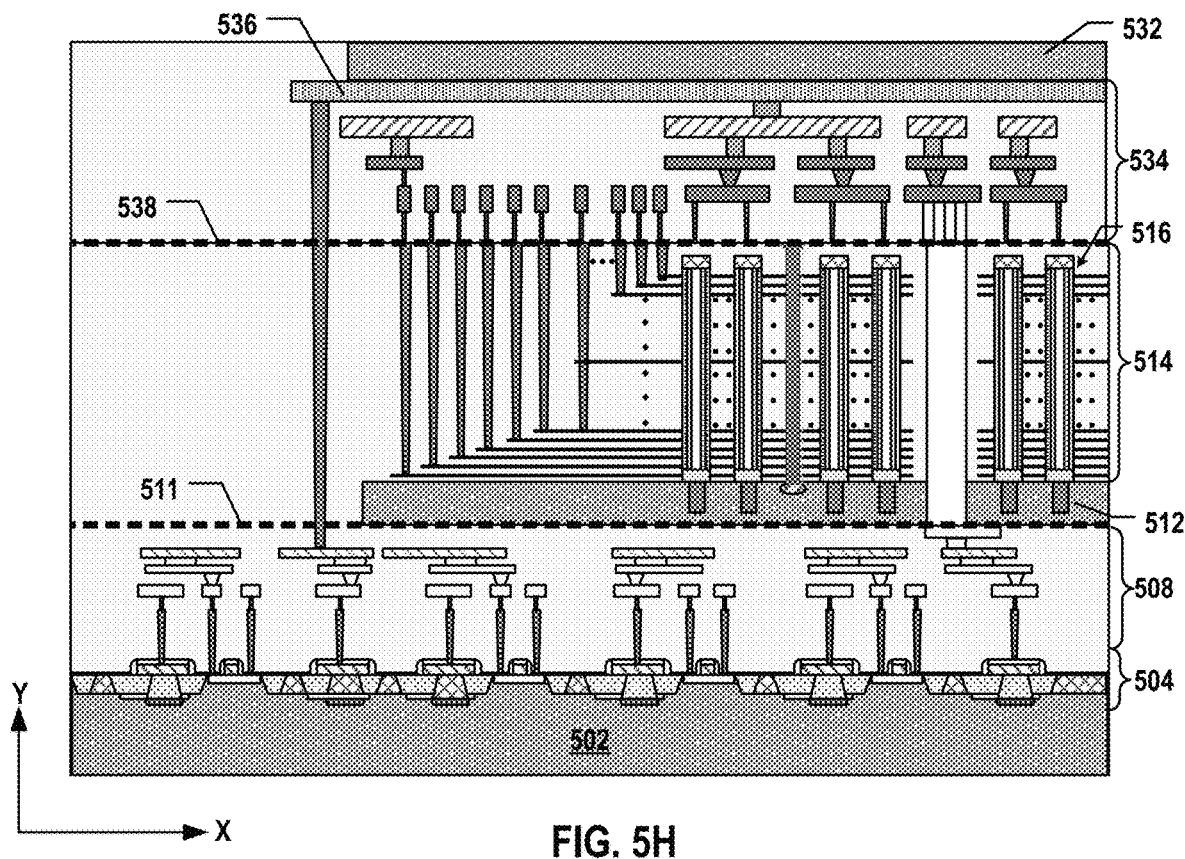

As illustrated in FIG. 5G, second single-crystal silicon layer 532 and array interconnect layer 534 formed thereon are split from second silicon substrate 510 along heterogeneous interface 533 by applying a mechanical force on second silicon substrate 510. In other words, second single-crystal silicon layer 532 and array interconnect layer 534 formed thereon can be broken and peeled off from second silicon substrate 510 along heterogeneous interface 533. As illustrated in FIG. 5H, second single-crystal silicon layer 532 and array interconnect layer 534 formed thereon can be flipped upside down, such that array interconnect layer 534 faces down toward the front side of first silicon substrate 502, i.e., the top surface of first memory stack 514. Second single-crystal silicon layer 532 and array interconnect layer 534 formed thereon and first memory stack 514 of first silicon substrate 502 then can be bonded in a face-to-face manner using hybrid bonding, resulting in a second bonding interface 538 between first memory stack 514 and array interconnect layer 534. Hybrid bonding (also known as "metal/dielectric hybrid bonding") is a direct bonding technology (e.g., forming bonding between surfaces without using intermediate layers, such as solder or adhesives) and can obtain metal-metal bonding and dielectric-dielectric bonding simultaneously. In some embodiments, a treatment process, e.g., a plasma treatment, a wet treatment, and/or a thermal treatment, is applied to the bonding surfaces prior to the hybrid bonding. As a result of the hybrid bonding, bonding contacts on different sides of second bonding interface 538 can be inter-mixed, and dielectrics on the different sides of second bonding interface 538 can be covalent-bonded. After the bonding, bit line 536 is electrically connected to first channel structure 516, and second single-crystal silicon layer 532 becomes above array interconnect layer 534, according to some embodiments.

Method 900 proceeds to operation 914, as illustrated in FIG. 9, in which a second channel structure extending vertically through a second memory stack above the second single-crystal silicon layer is formed. The second memory stack can include interleaved conductor layers and dielectric layers. The second channel structure includes a lower plug extending into the second single-crystal silicon layer and including single-crystal silicon, according to some embodiments.

Figure 5I:
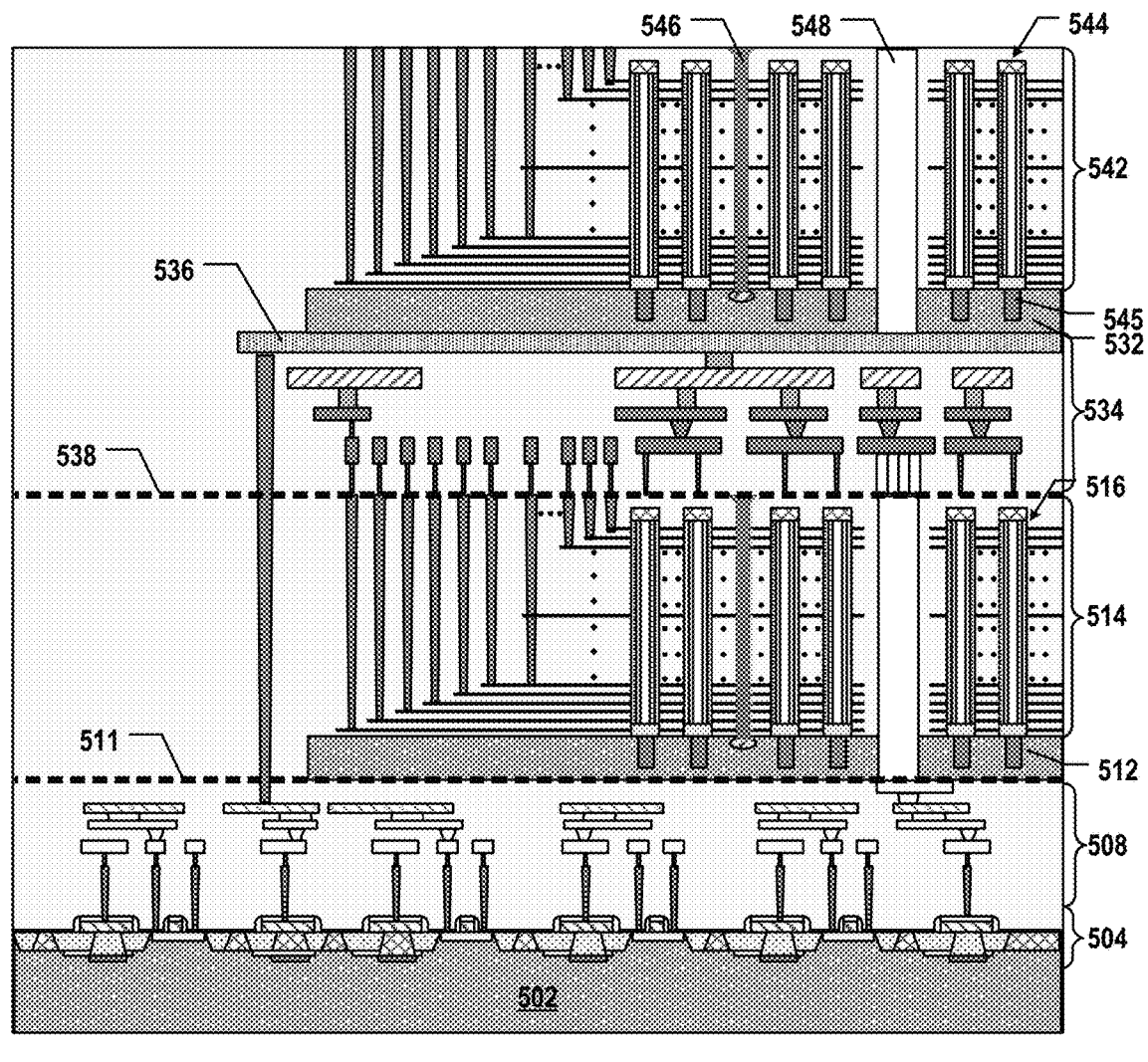

As illustrated in FIG. 5I, a memory stack 542 including interleaved conductor layers and dielectric layers is formed on second single-crystal silicon layer 532 by alternatingly depositing two different dielectric layers (e.g., silicon nitride and silicon oxide) using one or more thin film deposition processes, followed by a gate-replacement process later. In some embodiments, lower plugs 545, e.g., SEG plugs, are epitaxially grown into the bottom portion of each channel hole from second single-crystal silicon layer 532 using, for example, VPE, LPE, MBE, or any combinations thereof. Lower plugs 545 thus can include the same material as second single-crystal silicon layer 532, i.e., single-crystal silicon. Channel structures 544 including lower plugs 545 at the lower ends can then be formed by subsequently depositing a memory film and a semiconductor channel along the sidewall of each channel hole above lower plug 545 using thin film deposition processes. A slit structure 546 and a TAC 548 each extending vertically through memory stack 542 are formed, according to some embodiments. The fabrication processes for forming memory stack 542, channel structures 544, slit structure 546, and TAC 548 are substantially similar to their counterparts described above with respect to FIG. 5D and thus, are not repeated.

Figure 5J:
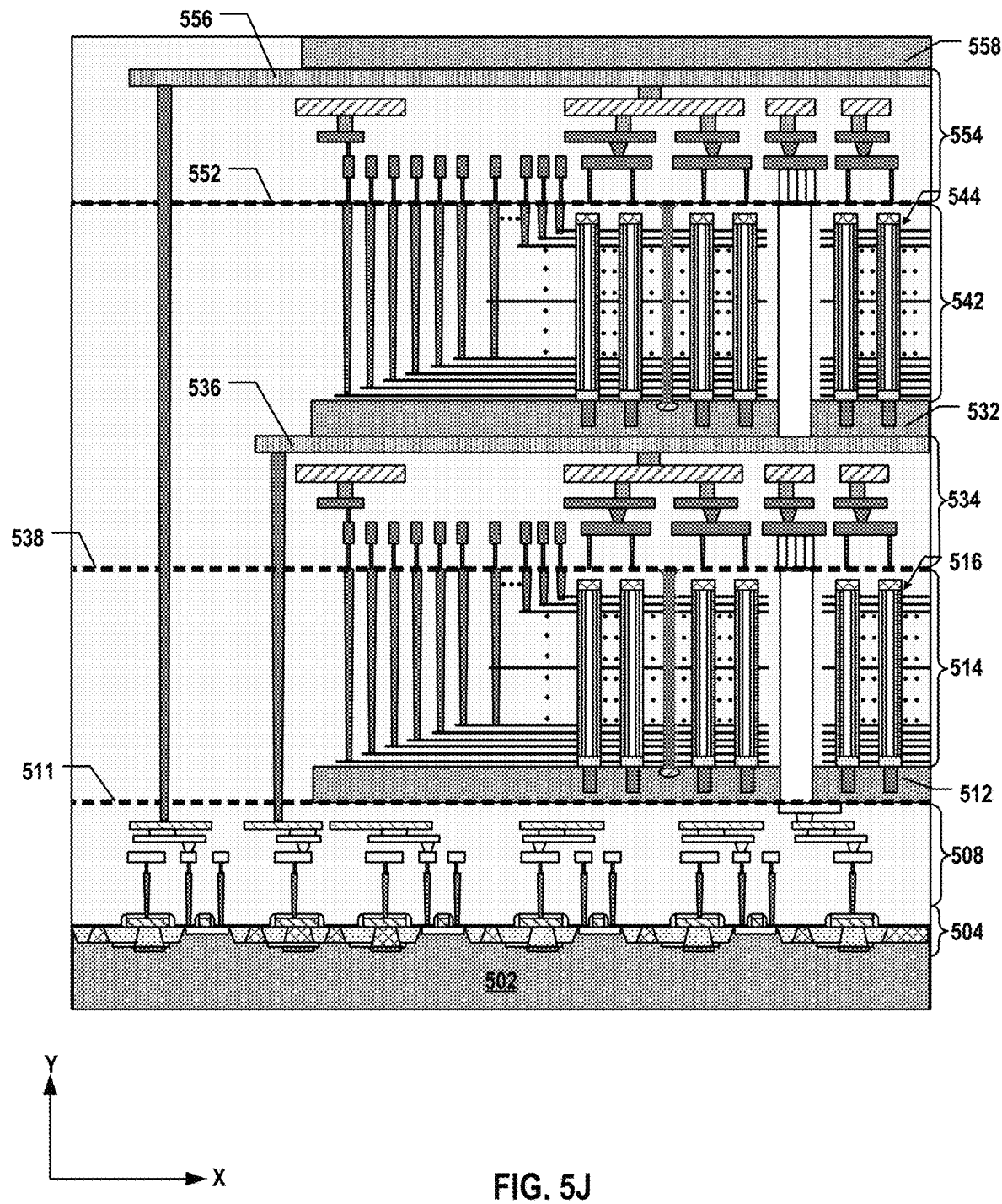

As illustrated in FIG. 5J, in some embodiments, an array interconnect layer 554 including a bit line 556 and a third single-crystal silicon layer 558 formed thereon are transferred from second silicon substrate 510 (or a different donor substrate) to be bonded onto memory stack 542 to form a third bonding interface 552. In some embodiments, forming array interconnect layer 554 includes forming bit line 556 in one or more ILD layers. As a result, bit line 556 can be electrically connected to channel structure 544, and third single-crystal silicon layer 558 becomes above array interconnect 554 layer. The fabrication processes for transferring array interconnect layer 554 and third single-crystal silicon layer 558 are substantially similar to their counterparts described above with respect to FIGS. 5E-5H and thus, are not repeated. It is understood that the fabrication processes described above for transferring interconnect layer and single-crystal silicon layer and forming memory stack and channel structure on the single-crystal silicon layer can be continuously repeated to increase the number of memory stacks in a multi-stack 3D memory device.

Figure 6A:
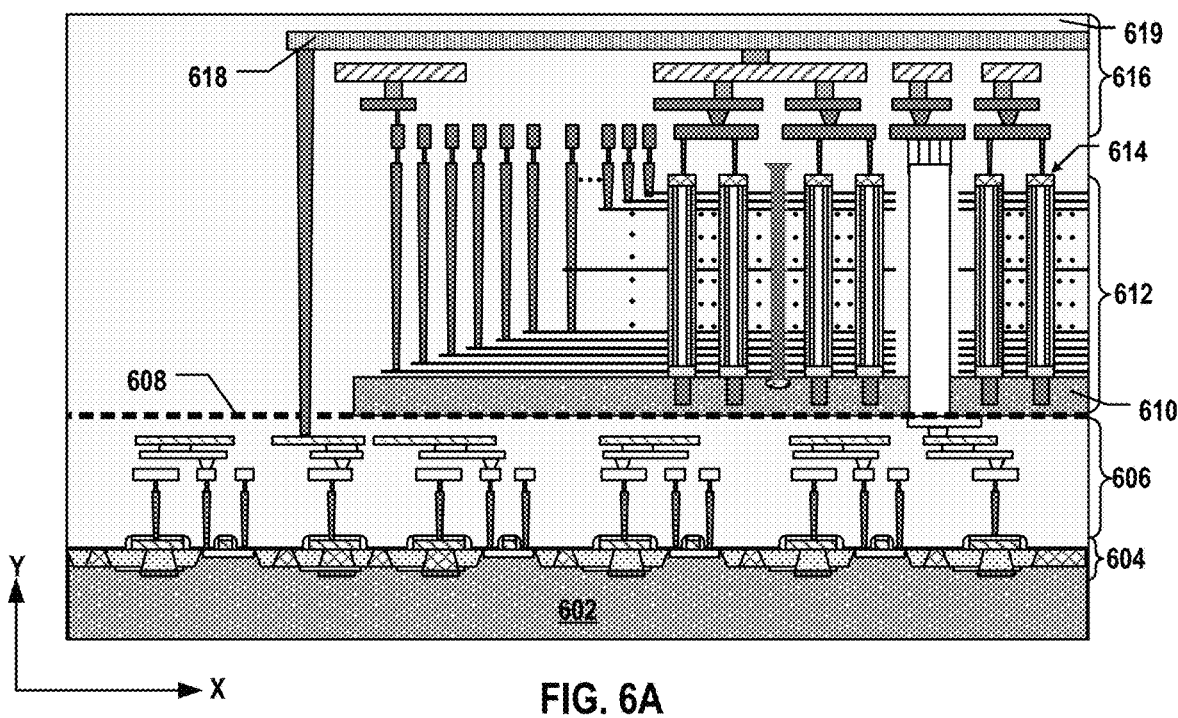
FIGS. 6A-6C illustrate an exemplary fabrication process for forming a multi-stack 3D memory device, according to some embodiments of the present disclosure.
Figure 6B:
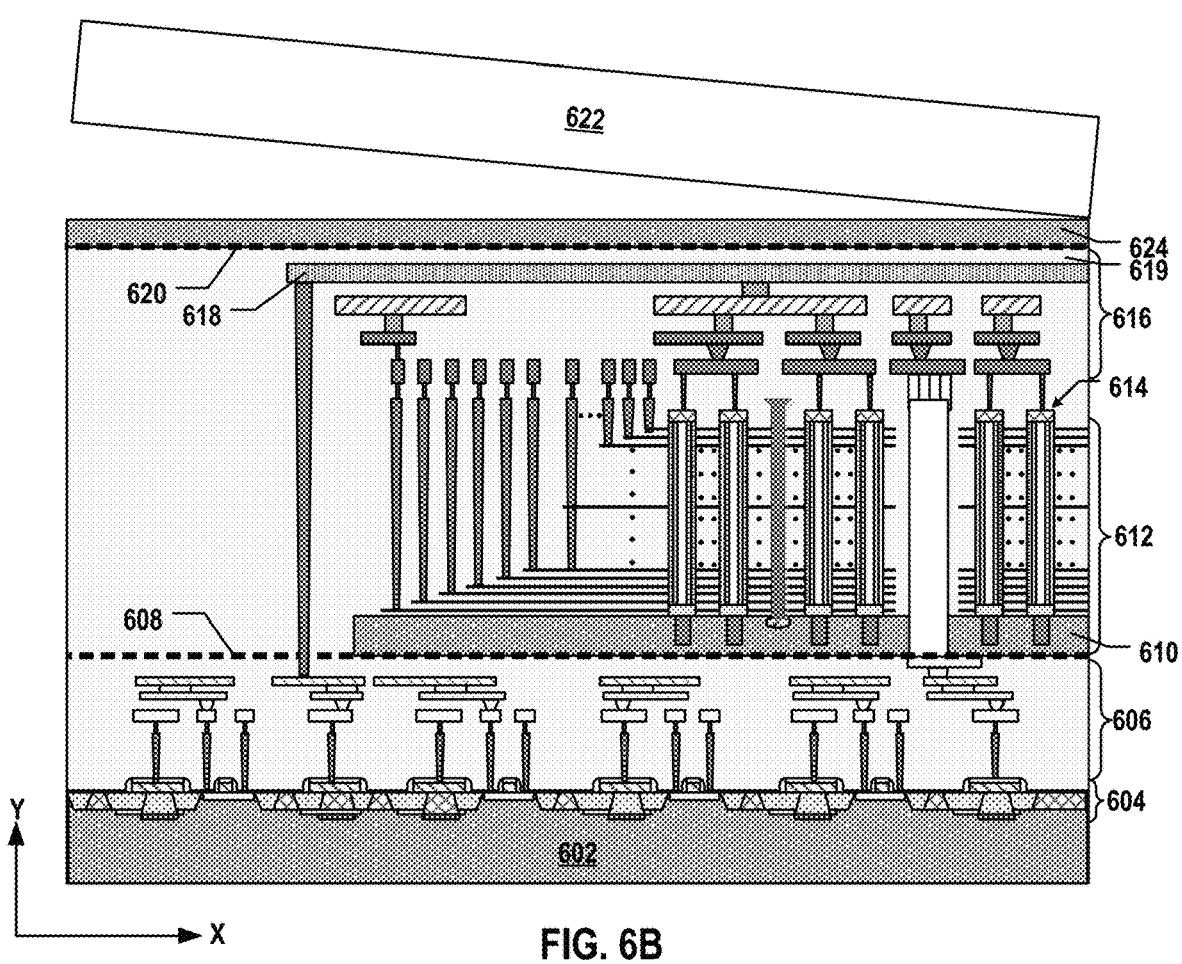
Figure 6C:
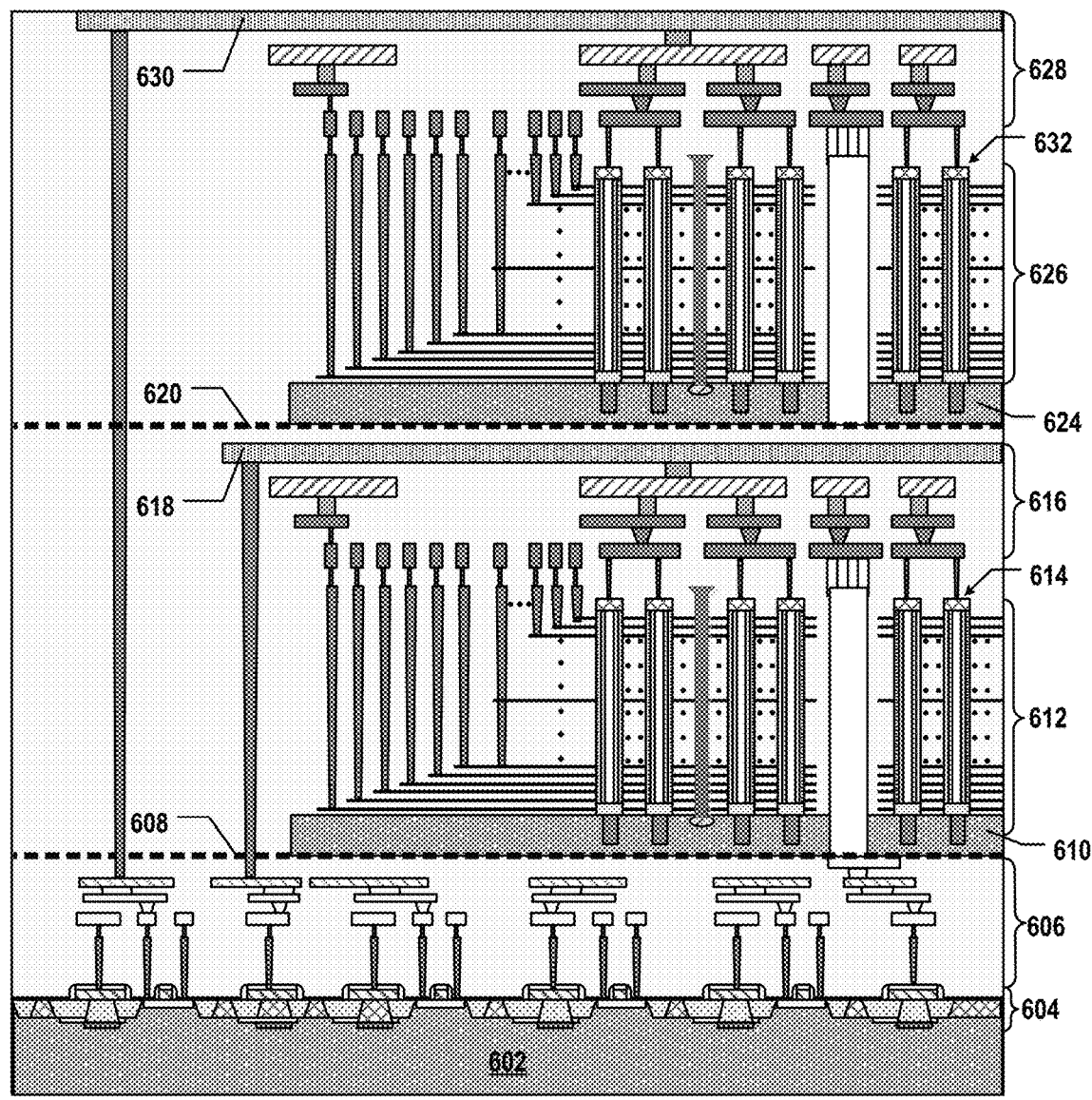
Figure 10:
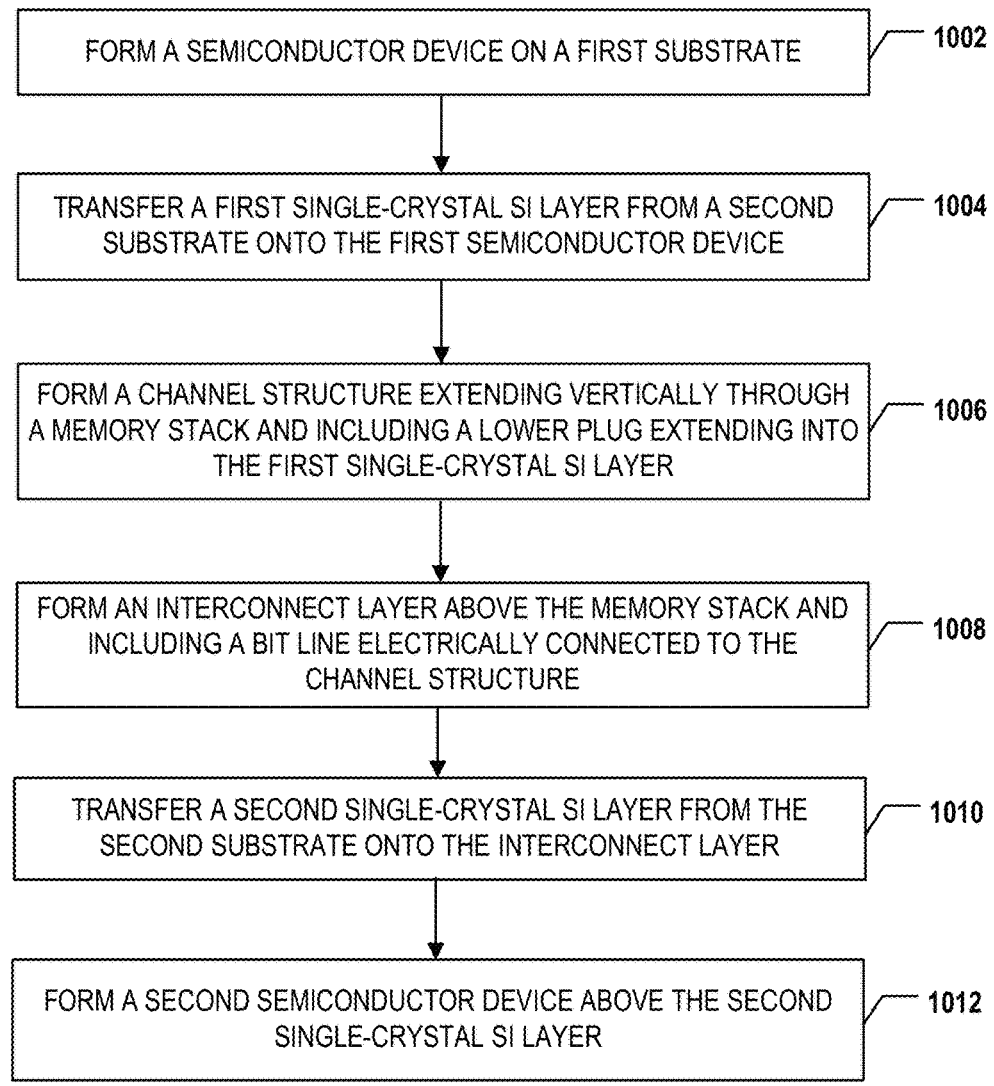
FIG. 10 is a flowchart of an exemplary method for forming a multi-stack 3D memory device, according to some embodiments of the present disclosure.

FIGS. 5A-5J and 9 illustrate exemplary fabrication process for forming a multi-stack 3D memory device having transferred interconnect layers. That is, array interconnect layers 534 and 554 and single-crystal silicon layers 512 and 532 are non-monolithically formed on one or more donor substrates (e.g., second silicon substrate 510) other than first silicon substrate 502 and later transferred above first silicon substrate 502 using a de-bonding process. It is understood that interconnect layers may be monolithically formed above first silicon substrate 502 by depositions of interconnects and ILD layers. FIGS. 6A-6C illustrate an exemplary fabrication process for forming a multi-stack 3D memory device, according to some embodiments of the present disclosure. FIG. 10 is a flowchart of an exemplary method 1000 for forming a multi-stack 3D memory device, according to some embodiments of the present disclosure. Examples of the 3D memory device depicted in FIGS. 6A-6C and 10 include 3D memory device 100 depicted in FIGS. 1A-1C. FIGS. 6A-6C and 10 will be described together. It is understood that the operations shown in method 1000 are not exhaustive and that other operations can be performed as well before, after, or between any of the illustrated operations. Further, some of the operations may be performed simultaneously, or in a different order than shown in FIG. 10.

Referring to FIG. 10, method 1000 starts at operation 1002, in which a semiconductor device is formed on a first substrate. In some embodiments, the semiconductor device includes a peripheral device layer. In some embodiments, the semiconductor device includes a channel structure extending vertically through a memory stack. An interconnect layer is formed above the semiconductor device on the first substrate, according to some embodiments. The substrate can be a silicon substrate.

As illustrated in FIG. 6A, a peripheral device layer 604 is formed on a first silicon substrate 602, and peripheral interconnect layer 606 is formed above peripheral device layer 604 on first silicon substrate 602. The fabrication processes for forming peripheral device layer 604 and peripheral interconnect layer 606 are substantially similar to those for forming the counterparts described above with respect to FIG. 5A and thus, are not repeated.

Method 1000 proceeds to operation 1004, as illustrated in FIG. 10, in which a first single-crystal silicon layer is transferred from a second substrate (a "donor substrate") onto the first semiconductor device on the first substrate. In some embodiments, to transfer the first single-crystal silicon layer, a heterogeneous interface is formed in the second substrate, for example, by implanting a dopant, such as hydrogen, into the second substrate. In some embodiments, to transfer the first single-crystal silicon layer, the second substrate and the first substrate are bonded in a face-to-face manner. In some embodiments, to transfer the first single-crystal silicon layer, the first single-crystal silicon layer is split from the second substrate along the heterogeneous interface in the second substrate to leave the first single-crystal silicon layer.

As illustrated in FIG. 6A, a first single-crystal silicon layer 610 is transferred from a second substrate (not shown) onto peripheral interconnect layer 606 using a de-bonding process, resulting a first bonding interface 608 between first single-crystal silicon layer 610 and peripheral interconnect layer 606. The fabrication processes for forming and transferring first single-crystal silicon layer 610 are substantially similar to those for forming the counterparts described above with respect to FIGS. 5B and 5C and thus, are not repeated.

Method 1000 proceeds to operation 1006, as illustrated in FIG. 10, in which a channel structure extending vertically through a memory stack above the first single-crystal silicon layer is formed. The memory stack can include interleaved conductor layers and dielectric layers. The channel structure includes a lower plug extending into the first single-crystal silicon layer and including single-crystal silicon, according to some embodiments. In some embodiments, to form the memory stack, a dielectric stack including interleaved sacrificial layers and dielectric layers is formed on the first single-crystal silicon layer, and the memory stack is formed by replacing the sacrificial layers in the dielectric stack with the conductor layers. For example, a slit opening extending vertically through the dielectric stack may be etched, the sacrificial layers in the dielectric stack may be replaced with the conductor layers through the slit opening, and a spacer and a conductor layer may be subsequently deposited into the slit opening. In some embodiments, to form the channel structure, a channel hole is etched through the dielectric stack and into the first single-crystal silicon layer, the lower plug is epitaxially grown into a bottom portion of the channel hole from the first single-crystal silicon layer, and a memory film and a semiconductor channel are subsequently deposited along a sidewall of the channel hole and above the lower plug.

As illustrated in FIG. 6A, a memory stack 612 including interleaved conductor layers and dielectric layers is formed on first single-crystal silicon layer 610. Channel structures 614 extending vertically through memory stack 612 can be formed. The fabrication processes for forming memory stack 612, channel structures 614, and other components, such as the slit structure and TAC are substantially similar to those for forming the counterparts described above with respect to FIG. 5D and thus, are not repeated.

Method 1000 proceeds to operation 1008, as illustrated in FIG. 10, in which an interconnect layer is formed above the memory stack. The interconnect layer can include a bit line electrically connected to the channel structure. As illustrated in FIG. 6A, an array interconnect layer 616 is formed above memory stack 612. Array interconnect layer 616 can include one or more ILD layers and interconnects therein, including a bit line 618, formed using multiple processes. For example, the interconnects can include conductive materials deposited by one or more thin film deposition processes including, but not limited to, CVD, PVD, ALD, electroplating, electroless plating, or any combination thereof. The ILD layers can include dielectric materials deposited by one or more thin film deposition processes including, but not limited to, CVD, PVD, ALD, or any combination thereof. In some embodiments, a passivation layer 619 (e.g., an ILD layer) is formed on bit line 618 of array interconnect layer 616, as shown in FIG. 6A. In some embodiments, array interconnect layer 616 does not include passivation layer 619 on bit line 618.

Method 1000 proceeds to operation 1010, as illustrated in FIG. 10, in which a second single-crystal silicon layer is transferred from the second substrate onto the first interconnect layer. The donor substrate from which the second single-crystal silicon layer may be the same substrate from which the first single-crystal silicon layer is transferred or a different donor substrate. As illustrated in FIG. 6B, a second single-crystal silicon layer 624 is formed in a second silicon substrate 622 and transferred onto array interconnect layer 616 using a de-bonding process, resulting a second bonding interface 620 between second single-crystal silicon layer 624 and array interconnect layer 616. In some embodiments, second single-crystal silicon layer 624 is formed on passivation layer 619, as shown in FIG. 6B. In some embodiments, second single-crystal silicon layer 624 is formed directly on bit line 618 without passivation layer 619 in-between. A well can be formed in second single-crystal silicon layer 624 using ion implantation and/or thermal diffusion. The fabrication processes for forming and transferring second single-crystal silicon layer 624 are substantially similar to those for forming the counterparts described above with respect to FIGS. 5B and 5C and thus, are not repeated.

Method 1000 proceeds to operation 1012, as illustrated in FIG. 10, in which a second semiconductor device is formed above the second single-crystal silicon layer. In some embodiments, the semiconductor device includes a peripheral device layer. In some embodiments, the semiconductor device includes a channel structure extending vertically through a memory stack.

As illustrated in FIG. 6C, a memory stack 626 including interleaved conductor layers and dielectric layers is formed on second single-crystal silicon layer 624. Channel structures 632 extending vertically through memory stack 626 can be formed. The fabrication processes for forming memory stack 626, channel structures 632, and other components, such as the slit structure and TAC are substantially similar to those for forming the counterparts described above with respect to FIG. 5D and thus, are not repeated. As illustrated in FIG. 6C, an array interconnect layer 628 is formed above memory stack 626. Array interconnect layer 628 can include one or more ILD layers and interconnects therein, including a bit line 630, formed using multiple processes. The fabrication processes for forming array interconnect layer 628 are substantially similar to those for forming the counterparts described above with respect to FIG. 6A and thus, are not repeated.

It is understood that the fabrication processes described above for transferring single-crystal silicon layer and forming memory stack and channel structure on the single-crystal silicon layer can be continuously repeated to increase the number of memory stacks in a multi-stack 3D memory device.

According to one aspect of the present disclosure, a 3D memory device includes a substrate, a first memory deck above the substrate, a first channel structure, a first inter-deck plug above and in contact with the first channel structure, a second memory deck above the first inter-deck plug, and a second channel structure above and in contact with the first inter-deck plug. The first memory deck includes a first plurality of interleaved conductor layers and dielectric layers. The first channel structure extends vertically through the first memory deck. The first inter-deck plug includes single-crystal silicon. The second memory deck includes a second plurality of interleaved conductor layers and dielectric layers. The second channel structure extends vertically through the second memory deck.

In some embodiments, a thickness of the first inter-deck plug is between about 1 μm and about 100 μm.

In some embodiments, the first channel structure includes an upper plug including polysilicon at an upper end of the first channel structure and a first memory film and a first semiconductor channel along a sidewall of the first channel structure. The first inter-deck plug is above and in contact with the upper plug of the first channel structure, according to some embodiments.

In some embodiments, the first channel structure includes a first memory film and a first semiconductor channel along a sidewall of the first channel structure. The first inter-deck plug is above and in contact with the first semiconductor channel of the first channel structure, according to some embodiments.

In some embodiments, the 3D memory device further includes a dielectric vertically between the first and second memory decks and that surrounds the first inter-deck plug.

In some embodiments, the 3D memory device further includes a bonding interface between the first memory deck and the first inter-deck plug.

In some embodiments, the 3D memory device further includes a slit structure extending vertically through the first and second memory decks to the substrate.

In some embodiments, the 3D memory device further includes an interconnect layer above the second memory deck and a through array contact (TAC) extending vertically through the first and second memory decks and electrically connected to the interconnect layer.

In some embodiments, the 3D memory device further includes a second inter-deck plug above and in contact with the second channel structure, a third memory deck above the second inter-deck plug, and a third channel structure above and in contact with the second inter-deck plug. In some embodiments, the second inter-deck plug includes single-crystal silicon, the third memory deck includes a third plurality of interleaved conductor layers and dielectric layers, and the third channel structure extends vertically through the third memory deck.

According to another aspect of the present disclosure, a method for forming a 3D memory device is disclosed. A first dielectric deck including a first plurality of interleaved sacrificial layers and dielectric layers is formed above a first substrate. A first channel structure extending vertically through the first dielectric deck is formed. A heterogeneous interface is formed in a second substrate. The second substrate and the first substrate are bonded in a face-to-face manner A single-crystal silicon layer is split from the second substrate along the heterogeneous interface in the second substrate to leave the single-crystal silicon layer bonded on the first dielectric deck. A first inter-deck plug including single-crystal silicon is patterned in the single-crystal silicon layer, such that the first inter-deck plug is above and in contact with the first channel structure. A second dielectric deck including a second plurality of interleaved sacrificial layers and dielectric layers is formed above the first inter-deck plug. A second channel structure extending vertically through the second dielectric deck is formed, such that the second channel structure is above and in contact with the first inter-deck plug. A first memory deck and a second memory deck each including interleaved conductor layers and the dielectric layers are formed by replacing the sacrificial layers in the first dielectric deck and the second dielectric deck with the conductor layers.

In some embodiments, to form the heterogeneous interface in the second substrate, a dopant is implanted into the second substrate. In some embodiments, the dopant includes hydrogen.

In some embodiments, a thickness of the single-crystal silicon layer is between about 1 µm and about 100 µm.

In some embodiments, to form the first channel structure, a first channel hole is etched through the first dielectric deck, a first memory film and a first semiconductor channel are subsequently deposited along a sidewall of the first channel hole, and an upper plug including polysilicon is formed at an upper end of the first channel hole, such that the first inter-deck plug is above and in contact with the upper plug of the first channel structure.

In some embodiments, to form the first channel structure, a first channel hole is etched through the first dielectric deck, a first memory film and a first semiconductor channel are subsequently deposited along a sidewall of the first channel hole, such that the first inter-deck plug is above and in contact with the first semiconductor channel of the first channel structure.

In some embodiments, to pattern the first inter-deck plug, a dielectric surrounding the first inter-deck plug is deposited.

In some embodiments, to form the first memory deck and the second memory deck, a slit opening extending vertically through the first and second dielectric decks is etched, the sacrificial layers in the first dielectric deck and the second dielectric deck are replaced with the conductor layers through the slit opening, and a spacer and a conductor layer are subsequently deposited into the slit opening.

In some embodiments, a TAC extending vertically through the first and second memory decks is formed, and an interconnect layer is formed above the second memory deck, and electrically connected to the TAC.

In some embodiments, the bonding includes silicon-dielectric bonding.

According to still another aspect of the present disclosure, a method for forming a 3D memory device is disclosed. a method for forming a 3D memory device is disclosed. A first channel structure extending vertically through a first dielectric deck including a first plurality of interleaved sacrificial layers and dielectric layers is formed above a first substrate. A first single-crystal silicon layer is transferred from a second substrate onto the first dielectric deck above the first substrate. A first inter-deck plug is patterned in the first single-crystal silicon layer, such that the first inter-deck plug is above and in contact with the first channel structure. A second channel structure extending vertically through a second dielectric deck including a second plurality of interleaved sacrificial layers and dielectric layers is formed above the first inter-deck plug, such that the second channel structure is above and in contact with the first inter-deck plug. A second single-crystal silicon layer is transferred from the second substrate onto the second dielectric deck above the first substrate. A second inter-deck plug is patterned in the second single-crystal silicon layer, such that the second inter-deck plug is above and in contact with the second channel structure. A third channel structure extending vertically through a third dielectric deck including a third plurality of interleaved sacrificial layers and dielectric layers is formed above the second inter-deck plug, such that the third channel structure is above and in contact with the second inter-deck plug.

In some embodiments, to transfer the first or second single-crystal silicon layer from the second substrate, a heterogeneous interface is formed in the second substrate, the second substrate and the first substrate are bonded in a face-to-face manner, and the first or second single-crystal silicon layer is split from the second substrate along the heterogeneous interface in the second substrate.

In some embodiments, to form the heterogeneous interface in the second substrate, a dopant is implanted into the second substrate. In some embodiments, the dopant includes hydrogen.

In some embodiments, the bonding includes silicon-dielectric bonding.

In some embodiments, a thickness of the first or second single-crystal silicon layer is between about 1 µm and about 100 µm.

In some embodiments, to pattern the first or second inter-deck plug, a dielectric surrounding the first or second inter-deck plug is deposited.

In some embodiments, a slit opening extending vertically through the first, second and third dielectric decks is etched, the sacrificial layers in the first, second and third dielectric decks are replaced with conductor layers through the slit opening to form a first memory deck, a second memory deck, and a third memory deck, respectively, and a spacer and a conductor layer are subsequently deposited into the slit opening.

In some embodiments, a TAC extending vertically through the first, second and third memory decks is formed, and an interconnect layer is formed above the third memory deck and electrically connected to the TAC.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming a first dielectric deck comprising a first plurality of interleaved sacrificial layers and dielectric layers above a first substrate;
    forming a first channel structure extending vertically through the first dielectric deck;
    forming a heterogeneous interface in a second substrate;
    bonding the second substrate and the first substrate in a face-to-face manner;
    splitting a single-crystal silicon layer from the second substrate along the heterogeneous interface in the second substrate to leave the single-crystal silicon layer bonded on the first dielectric deck;
    patterning a first inter-deck plug comprising single-crystal silicon in the single-crystal silicon layer, such that the first inter-deck plug is above and in contact with the first channel structure;
    forming a second dielectric deck comprising a second plurality of interleaved sacrificial layers and dielectric layers above the first inter-deck plug;
    forming a second channel structure extending vertically through the second dielectric deck, such that the second channel structure is above and in contact with the first inter-deck plug; and
    forming a first memory deck and a second memory deck each comprising interleaved conductor layers and the dielectric layers by replacing the sacrificial layers in the first dielectric deck and the second dielectric deck with the conductor layers.

2. The method of claim 1, wherein forming the heterogeneous interface in the second substrate comprises implanting a dopant into the second substrate.

3. The method of claim 2, wherein the dopant comprises hydrogen.

4. The method of claim 1, wherein a thickness of the single-crystal silicon layer is between about 1 μm and about 100 μm.

5. The method of claim 1, wherein forming the first channel structure comprises:
    etching a first channel hole through the first dielectric deck;
    subsequently depositing a first memory film and a first semiconductor channel along a sidewall of the first channel hole; and
    forming an upper plug comprising polysilicon at an upper end of the first channel hole, such that the first inter-deck plug is above and in contact with the upper plug of the first channel structure.

6. The method of claim 1, wherein forming the first channel structure comprises:
    etching a first channel hole through the first dielectric deck; and
    subsequently depositing a first memory film and a first semiconductor channel along a sidewall of the first channel hole, such that the first inter-deck plug is above and in contact with the first semiconductor channel of the first channel structure.

7. The method of claim 1, wherein patterning the first inter-deck plug comprises depositing a dielectric surrounding the first inter-deck plug.

8. The method of claim 1, wherein forming the first memory deck and the second memory deck comprises:
    etching a slit opening extending vertically through the first and second dielectric decks;
    replacing the sacrificial layers in the first dielectric deck and the second dielectric deck with the conductor layers through the slit opening; and
    subsequently depositing a spacer and a conductor layer into the slit opening.

9. The method of claim 1, further comprising:
    forming a through array contact (TAC) extending vertically through the first and second memory decks; and
    forming an interconnect layer above the second memory deck and electrically connected to the TAC.

10. The method of claim 1, wherein the bonding comprises silicon-dielectric bonding.

11. A method for forming a three-dimensional (3D) memory device, comprising:
    forming a first channel structure extending vertically through a first dielectric deck comprising a first plurality of interleaved sacrificial layers and dielectric layers above a first substrate;
    transferring a first single-crystal silicon layer from a second substrate onto the first dielectric deck above the first substrate;
    patterning a first inter-deck plug in the first single-crystal silicon layer, such that the first inter-deck plug is above and in contact with the first channel structure;
    forming a second channel structure extending vertically through a second dielectric deck comprising a second plurality of interleaved sacrificial layers and dielectric layers above the first inter-deck plug, such that the second channel structure is above and in contact with the first inter-deck plug;
    transferring a second single-crystal silicon layer from the second substrate onto the second dielectric deck above the first substrate;
    patterning a second inter-deck plug in the second single-crystal silicon layer, such that the second inter-deck plug is above and in contact with the second channel structure; and
    forming a third channel structure extending vertically through a third dielectric deck comprising a third plurality of interleaved sacrificial layers and dielectric layers above the second inter-deck plug, such that the third channel structure is above and in contact with the second inter-deck plug.

12. The method of claim 11, wherein transferring the first or second single-crystal silicon layer from the second substrate comprises:
    forming a heterogeneous interface in the second substrate;
    bonding the second substrate and the first substrate in a face-to-face manner; and
    splitting the first or second single-crystal silicon layer from the second substrate along the heterogeneous interface in the second substrate.

13. The method of claim 12, wherein forming the heterogeneous interface in the second substrate comprises implanting a dopant into the second substrate.

14. The method of claim 13, wherein the dopant comprises hydrogen.

15. The method of claim 12, wherein the bonding comprises silicon-dielectric bonding.

16. The method of claim 11, wherein a thickness of the first or second single-crystal silicon layer is between about 1 μm and about 100 μm.

17. The method of claim 11, wherein patterning the first or second inter-deck plug comprises depositing a dielectric surrounding the first or second inter-deck plug.

18. The method of claim 11, further comprising:
    etching a slit opening extending vertically through the first, second, and third dielectric decks;
    replacing the sacrificial layers in the first, second, and third dielectric decks with conductor layers through the slit opening to form a first memory deck, a second memory deck, and a third memory deck, respectively; and
    subsequently depositing a spacer and a conductor layer into the slit opening.

19. The method of claim 18, further comprising:
    forming a through array contact (TAC) extending vertically through the first, second, and third memory decks; and
    forming an interconnect layer above the third memory deck and electrically connected to the TAC.

* * * * *